United States Patent
Naidu et al.

(10) Patent No.: US 12,278,472 B2
(45) Date of Patent: Apr. 15, 2025

(54) FAULT CLASSIFICATION AND ZONE IDENTIFICATION IN A POWER TRANSMISSION SYSTEM

(71) Applicant: HITACHI ENERGY LTD, Zürich (CH)

(72) Inventors: Od Naidu, Karnataka (IN); Neethu George, Karnataka (IN)

(73) Assignee: HITACHI ENERGY LTD, Zürich (CH)

( * ) Notice: Subject to any disclaimer, the term of this patent is extended or adjusted under 35 U.S.C. 154(b) by 110 days.

(21) Appl. No.: 18/269,989

(22) PCT Filed: Dec. 22, 2021

(86) PCT No.: PCT/EP2021/087399
§ 371 (c)(1),
(2) Date: Jun. 28, 2023

(87) PCT Pub. No.: WO2022/144286
PCT Pub. Date: Jul. 7, 2022

(65) Prior Publication Data
US 2024/0063626 A1    Feb. 22, 2024

(30) Foreign Application Priority Data

Dec. 31, 2020 (IN) .............................. 202041057544
May 6, 2021 (EP) ..................................... 21172518

(51) Int. Cl.
*H02H 1/00*     (2006.01)
*G01R 31/08*    (2020.01)
*H02H 7/22*     (2006.01)

(52) U.S. Cl.
CPC ......... *H02H 1/0007* (2013.01); *G01R 31/085* (2013.01); *H02H 7/226* (2013.01)

(58) Field of Classification Search
CPC .... G01R 31/52; G01R 31/085; G01R 31/088; H02H 1/0007; H02H 3/34; H02H 3/44;
(Continued)

(56) References Cited

U.S. PATENT DOCUMENTS

| 9,594,112 B2 | 3/2017 | Schweitzer, III et al. |
| 2016/0077149 A1* | 3/2016 | Schweitzer, III ...... G01R 31/08 307/131 |
| 2017/0117701 A1* | 4/2017 | Johannesson .......... H02H 3/305 |

FOREIGN PATENT DOCUMENTS

| CN | 103235213 A | * | 8/2013 |
| CN | 103235213 B |   | 7/2015 |

(Continued)

OTHER PUBLICATIONS

Machine translation of Feng et al. Chinese Patent Document CN 103235213 A Aug. 2013 (Year: 2013).*

(Continued)

*Primary Examiner* — Kevin J Comber
(74) *Attorney, Agent, or Firm* — Procopio, Cory, Hargreaves & Savitch LLP

(57) ABSTRACT

Fault classification and zone identification in a power transmission system are described. Voltage or current measurements are obtained at a terminal of the transmission line in each of the three phases measured during a fault. Modal transformations are performed on voltage or current measurements to obtain traveling wave signals with reference to each of the three phases. Based on the magnitude of the traveling wave signals the fault is classified.

10 Claims, 17 Drawing Sheets

(58) Field of Classification Search
CPC ........ H02H 3/353; H02H 3/343; H02H 7/265; H02H 7/226
USPC .......................................................... 361/87
See application file for complete search history.

(56) References Cited

FOREIGN PATENT DOCUMENTS

| WO | 2015139719 A1 | 9/2015 | |
|---|---|---|---|
| WO | WO-2020089730 A1 * | 5/2020 | ........... G01R 31/085 |

OTHER PUBLICATIONS

Jena et al. "Initial Travelling Wavefront-Based Bus Zone Protection Scheme", IET Generation, Transmission&Distribution, IET, UK, vol. 13, No. 15, Jul. 17, 2019, ISSN: 1751-8687, pp. 216-3229.

Schweitzer et al., "Performance of Time-Domain Line Protection Elements on Real-World Faults", Apr. 2016, IEEE Xplore, 2016 69th Annual Conference for Protective Relay Engineers (CPRE). DOI: 10.1109/CPRE.2016.7914904, 17 pages.

Schweitzer et al. "Speed of Line Protection—Can We Break Free of Phasor Limitations?", 41st Annual Western Protective Relay Conference, Oct. 2014, pp. 448-461.

Vrana et al., "Transmission Line Length Estimation based on Electrical Parameters", Mediterranean Conference on Power Generation, Transmission, Distribution and Energy Conversion (Medpower 2018), 2018, pp. 1-7.

Guzman et al., "Traveling-Wave and Incremental Quantity Directional Elements Speed Up Directional Comparison Protection Schemes", 14th International Conference on Developments in Power System Protection, Mar. 2018, 7 pages.

Abebe et al., "Overhead Transmission Line Sag, Tension and Length Calculation using Affine Arithmetic," 2015 IEEE Power, Communication and Information Technology Conference (PCITC), 2015, 6 pages.

Akimoto et al., "Power line protection using wave theory (Part 2. Consideration of practical application method)", Institute of Electrical Engineers of Japan Journal B, 1978, 17 pages.

* cited by examiner

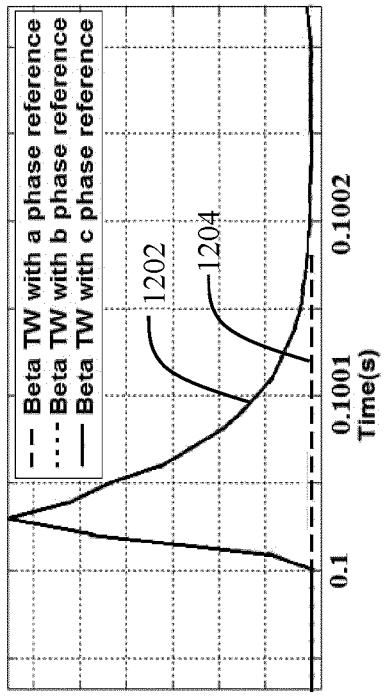
Fig. 11
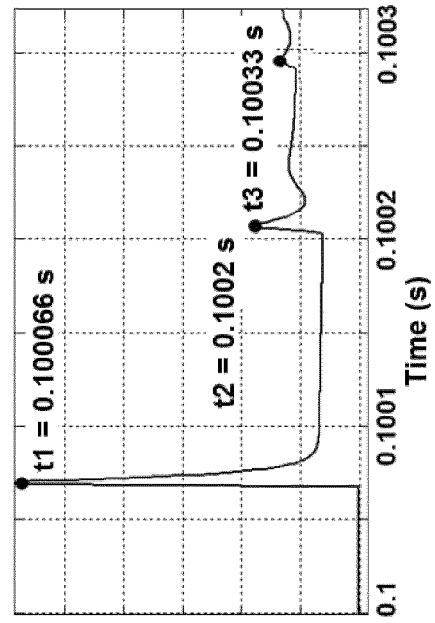
Fig. 12(a)
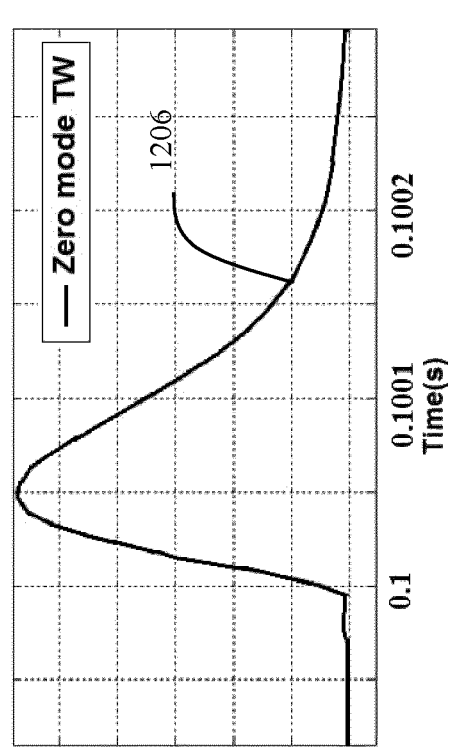
Fig. 12(b)
Fig. 13

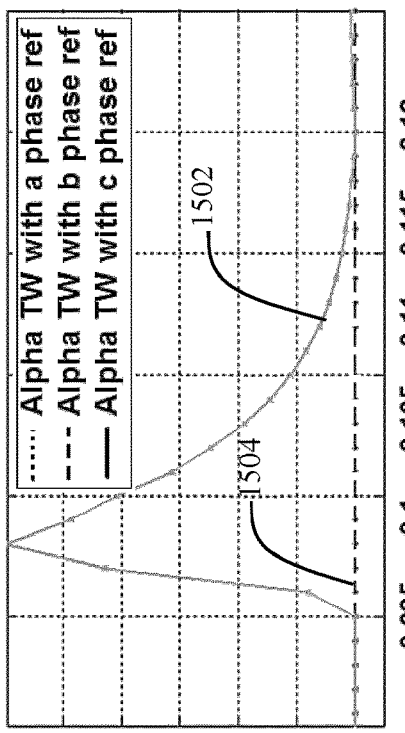
Fig. 14
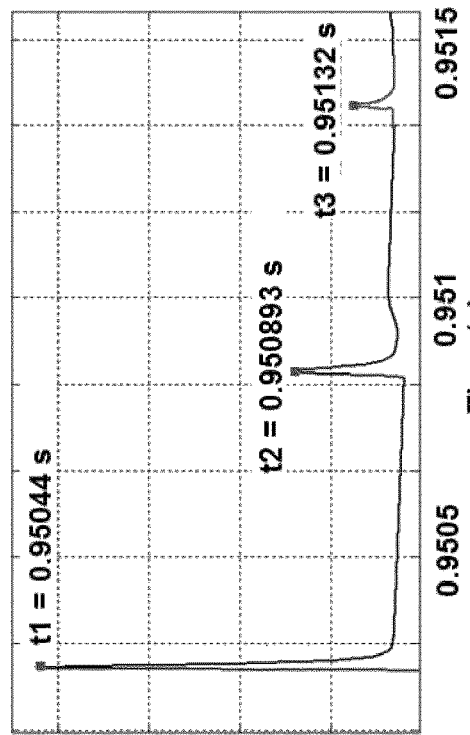
Fig. 15(a)
Fig. 15(b)
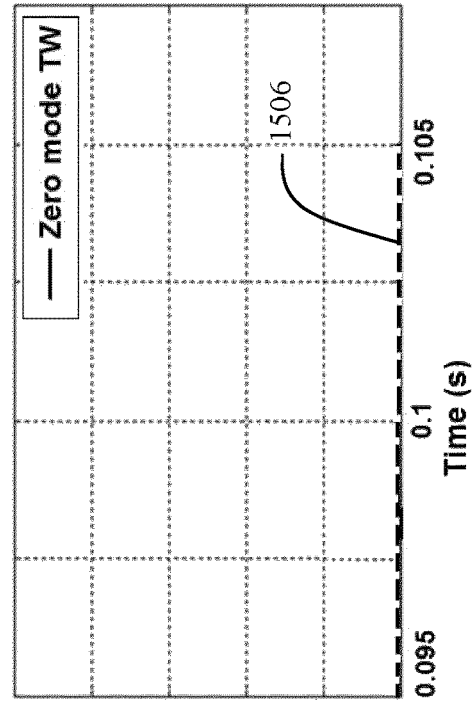
Fig. 16

FAULT CLASSIFICATION AND ZONE IDENTIFICATION IN A POWER TRANSMISSION SYSTEM

CROSS-REFERENCE TO RELATED APPLICATIONS

The present application is a national stage entry of International Patent Application No. PCT/EP2021/087399, filed on Dec. 22, 2021, which claims priority to Indian Application No. 202041057544, filed on Dec. 31, 2020, and European Application No. 21172518.9, filed on May 6, 2021, which are all hereby incorporated herein by reference as if set forth in full.

TECHNICAL FIELD

The present subject matter relates, in general, to fault classification and zone identification in power transmission systems.

BACKGROUND

An electric power transmission system is a large and complex network that comprises transmission lines with numerous electrical components, such as generators, transformers, shunt reactors, etc. Power systems are often subjected to system disturbances, such as transmission line faults, loss of generation units, switching operations in heavily loaded transmission lines, changes in load magnitudes and direction, etc. Generally, a fault may be defined as an abnormal condition of the electrical system causing disruption in the normal flow of electric current. This deviated flow of electric current causes changes in voltage and/or current flow, which interrupts power transmission.

As power systems are facing a paradigm shift, electric power grids around the world are undergoing a significant change in generation mix from synchronous AC rotating machines to Inverter-Based Resource (IBR) technologies. A natural outcome of this trend is more deployment of renewable power sources both at transmission and distribution networks. In addition to well-known environmental benefits, introduction of these non-conventional technologies changes the operation of power systems due to, for example, reduced inertia, less stability margins, and more unpredictability. Since most of these renewable technologies are inverter interfaced, their behaviour under fault conditions is different than that of conventional rotating machines. This creates new challenges in power system protection. Further, an issue with higher penetration of inverter-based resources, such as wind and solar photovoltaic (PV) generation, is a reduction in fault currents and short circuit strength of the power grid.

SUMMARY

Embodiments of the present invention provide a method for classification of a fault, a method for zone identification of a fault, devices for fault classification and zone identification, and computer readable storage media for fault classification and zone identification in a power transmission system.

Objectives of embodiments of the invention may be to clear faults rapidly and accurately in power transmission systems irrespective of the type of power generation sources connected in the power transmission systems and particularly in power transmission systems that include IBRs. For example, the faults may be cleared in less than quarter cycle time in systems with strong sources. In another example, faults may be cleared in less than 5-7 ms in power transmission systems that include IBRs.

According to a first aspect, a method for fault classification is provided. The method comprises obtaining voltage or current measurements at a terminal of a transmission line in each of the three phases measured during a fault. Modal transformations are performed on the voltage or current measurements to obtain traveling wave signals with reference to each of the three phases. Further, based on a magnitude of the traveling wave signals, the fault is classified.

According to an implementation, the fault classification is performed without using an incremental quantity of the voltage or current measurements with reference to time.

According to an implementation, the modal transformation is a Clarkes Transformation.

According to an implementation, the method generates a trip signal to cause a single-phase trip or a three-phase trip based on the classification of the fault.

According to an implementation, the traveling wave signals include zero mode traveling wave signals with reference to each of the three phases and the method comprises comparing a magnitude of the zero mode traveling wave signals with a zero mode threshold value to differentiate a fault involving ground from a fault that does not involve ground.

According to an implementation, the traveling wave signals further include beta mode traveling wave signals with reference to each of the three phases and the method comprises, when the fault involves ground, classifying the fault as involving a first phase of the three phases and ground when a first condition is satisfied. The first condition is satisfied when a magnitude of beta traveling wave signal with reference to the first phase is a minimum of the magnitudes of beta traveling wave signals of each of the three phases and is less than a beta mode threshold value.

According to an implementation, the traveling wave signals further include alpha mode traveling wave signals with reference to each of the three phases and the method comprises, when the fault involves ground, classifying the fault as involving two phases of the three phases and the ground when a second condition is satisfied. The second condition is satisfied when a magnitude of alpha traveling wave signal with reference to a third phase of the three phases is a minimum of the magnitudes of alpha traveling wave signals of each of the three phases. Further, when the fault involves ground and the second condition is not satisfied, the fault is classified as involving the three phases and the ground. Further, when the fault does not involve ground, the method comprises classifying the fault as involving two phases of the three phases when a third condition is satisfied. The third condition is satisfied when the magnitude of alpha traveling wave signal with reference to a third phase of the three phases is a minimum of the magnitudes of alpha traveling wave signals of each of the three phases and is less than an alpha mode threshold value. Further, when the third condition is not satisfied and the ground is not involved, the fault is classified as involving the three phases.

According to an implementation, the terminal is connected to a synchronous power generation resource or a grid connected transmission line or an inverter-based power generation resource.

According to a second aspect, a method for zone identification of a fault is provided. A zone of a transmission line where the fault lies is identified based on traveling wave signals when a difference between a computed line length and an actual line length is less than a threshold line length. The zone of the transmission line where the fault lies is identified based on a rate of change of incremental terminal current with reference to time when the difference between the computed line length and the actual line length is greater than the threshold line length.

According to an implementation, the method for zone identification of a fault comprises receiving an identification of a transmission line having the fault; and computing a line length of the transmission line, to obtain the computed line length, based on traveling wave signals obtained from modal transformations performed on voltage or current measurements determined at a terminal of the transmission line during the fault.

According to an implementation, the zone identified based on the traveling wave signals lies in a range of one-thirds to two-thirds of the actual line length from the terminal and the zone identified based on the rate of change of incremental terminal current lies in a range of one-thirds of the actual line length from the terminal.

According to a third aspect, a method for fault classification and zone identification comprises the method for fault classification as disclosed herein and the method for zone identification as disclosed herein.

According to a fourth aspect, an intelligent electronic device that executes the methods for fault classification and/or zone identification is disclosed.

According to a fifth aspect, a non-transitory computer readable medium containing program instructions that, when executed, cause a processor to execute the method for fault classification and/or fault zone identification is disclosed.

BRIEF DESCRIPTION OF DRAWINGS

The features, aspects, and advantages of the present subject matter will be better understood with regard to the following description and accompanying figures. The use of the same reference number in different figures indicates similar or identical features and components.

FIG. 11 depicts, in a first example of a first scenario, the plot of threshold and actual rate of change of incremental currents for fault zone identification.

FIGS. 12(a) and 12 (b) illustrate, in a first example of a first scenario, the first peaks of beta and zero mode traveling wave signals recorded at bus M, in accordance with an embodiment of the present subject matter.

FIG. 13 illustrates, in a first example of a first scenario, traveling wave signals recorded at bus M depicting the first three peaks and their arrival times, in accordance with an embodiment of the present subject matter.

FIG. 14 depicts, in a second example of a first scenario, the plot of threshold and actual rate of change of incremental currents for fault zone identification.

FIGS. 15 (a) and 15 (b) illustrate in a second example of a first scenario, the first peaks of alpha and zero mode traveling wave signals recorded at bus M, in accordance with an embodiment of the present subject matter.

FIG. 16 illustrates, in a second example of a first scenario, traveling wave signals recorded at bus M depicting the first three peaks and their arrival times, in accordance with an embodiment of the present subject matter.

DETAILED DESCRIPTION

Figure 1A:
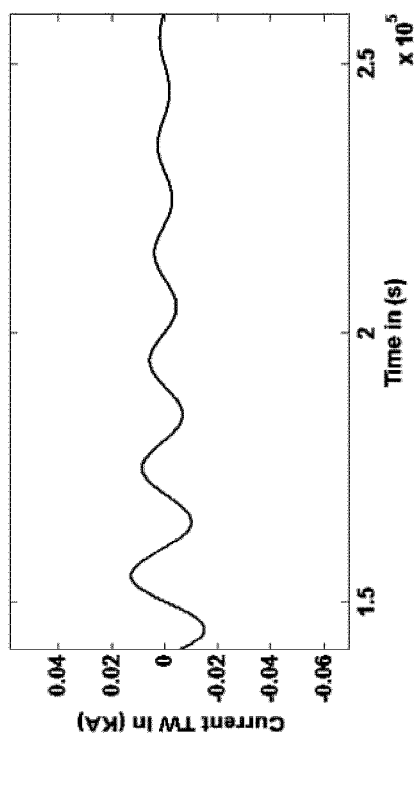
FIGS. 1(a) and 1(b) illustrate monitoring of traveling wave signals for a phase A to ground (A-g) fault with reference to phase A in (a) alpha mode and (b) beta mode, in accordance with an embodiment of the present subject matter.

The present subject matter relates to fault classification and zone identification in a power transmission system. The following describes fault classification and zone identification in relation to power systems that include Inverter Based Resource technologies as an example. The subject matter, however, is not restricted to the fault classification and zone identification in power systems with IBRs.

Stability margin of a power system depends on the inertia of the power system and it determines the desired speed of the protection scheme used for identifying and clearing faults in the power system. Power systems that include IBRs have low inertia and hence lesser stability margins. Reduced stability margin implies lower critical clearing time. Faults must be cleared faster than the critical clearing time or else the system may lose transient stability, which may lead to a system blackout. The integration of renewable sources to power grids thus demands high speed protection to maintain system stability limits.

Conventionally, time domain protection principles are used for high speed line protection. High sampling rates, processing power, and communication capabilities of new relay hardware platforms are used to improve line protection operating speed. However, these solutions have a drawback when it comes to speed. Moreover, the increasing addition of renewable sources to the main power grid is anticipated to decrease overall inertia, especially with high solar photovoltaic (PV) generation integration. This may reduce the inertia constant and transient stability margin of the power system which in turn will result in reduction of critical clearing time to maintain stable operation of the grid.

In one conventional technique, time-domain based algorithm, which is based on rate of change of incremental terminal current, is used for fault zone identification. A threshold rate of change of incremental terminal current is calculated by assuming that the fault is at the set zone-1 boundary. The actual rate of change of incremental terminal current is calculated from the terminal current measurement. When the actual rate is greater than the threshold rate, the fault is identified to be within the set zone-1 boundary. Alternately, if the actual rate is less than the threshold rate, the fault is identified to be beyond the set zone-1 boundary and trip signal is not produced.

The time-domain based zone identification as described above generates trip signal with 100% reliability within <5 ms, for faults within 50% of normal transmission line systems with traditional power generation sources as depicted in Table I.

TABLE I

PERFORMANCE OF TIME-DOMAIN BASED ZONE IDENTIFICATION - SYSTEM WITH TRADITIONAL SOURCE
Performance of time-domain based zone identification - system with traditional power generation source

| | Fault Location | | | | | | |
|---|---|---|---|---|---|---|---|
| | 2% | 20% | 32% | 34% | 50% | 65% | 67% |
| Reliability | 100 | 100 | 100 | 100 | 100 | 99.6 | 98.9 |
| Avg. trip time (ms) | 2.5 | 3.4 | 4.6 | 4.9 | 5.0 | 6.8 | 7.2 |

However, for transmission line systems with inverter-based sources, the reliability of time-domain based zone identification drops down to 86% even for faults at 50% of the line. The average trip time also undesirably increases as depicted in Table II shown below.

TABLE II

PERFORMANCE OF TIME-DOMAIN BASED ZONE IDENTIFICATION - SYSTEM WITH INVERTER-BASED SOURCES
Performance of time-domain based zone identification - system with inverter-based sources

| | Fault Location | | | | | | |
|---|---|---|---|---|---|---|---|
| | 2% | 20% | 32% | 34% | 50% | 65% | 67% |
| Reliability | 100 | 100 | 100 | 100 | 86 | 67 | 65 |
| Avg. trip time (ms) | 4.5 | 5.1 | 5.8 | 6.5 | 11.4 | 12.1 | 12.5 |

Therefore, the time-domain based zone identification based on the conventional techniques may be insufficient for reliable and fast protection of transmission lines with inverter-based sources. Therefore, there is a need for fast distance protection technology, i.e., fault classification and zone identification, which can protect power systems.

The present subject matter provides a method for rapid fault classification and fast and accurate zone identification. The fault classification (phase selection) is achieved based on traveling wave signals obtained from modal transformation of current or voltage measurements. Further, on fault classification, fault reach or zone is identified based on the combination of incremental quantity and traveling wave principles. Thus, a hybrid approach which combines incremental quantity in time domain and traveling wave-based distance protection approach is provided, which achieves better dependability and speed without compromising security. The approach is suited for all power systems irrespective of the power generation sources used, and in particular for Inverter Based Resources (IBRs) systems.

The methods and devices disclosed herein can clear faults in less than quarter cycle time for systems having traditional power generation sources. The method can clear the faults in less than 5-7 ms for IBR systems. Further, the method can be applied to series compensated lines and does not maloperate during power swings and hence may not require power swing blocking functions.

The above and other features, aspects, and advantages of the subject matter will be better explained with regard to the following description and accompanying figures. Wherever possible, the same reference numbers are used in the drawings and the following description to refer to the same or similar parts. While several examples are described, modifications, adaptations, and other implementations are possible.

Traveling wave signals obtained with reference to the three phases during simulation of different types of faults in a power transmission line are first discussed to establish the principles based on which rapid fault classification may be performed. For this, as an example, a 220 kV, 150 km long transmission line is considered and the alpha and beta components of traveling wave signals for four types of faults are monitored. In this example, the following faults have been considered: A-g (phase to ground fault), BC (phase to phase fault), CA-g (phase to phase to ground fault), and ABC-g (three-phase to ground fault) for the sake of discussion. However, the alpha and beta components of traveling wave signals for faults between other phase to ground, phase to phase, and phase to phase to ground faults would also give similar results.

Figure 1B:
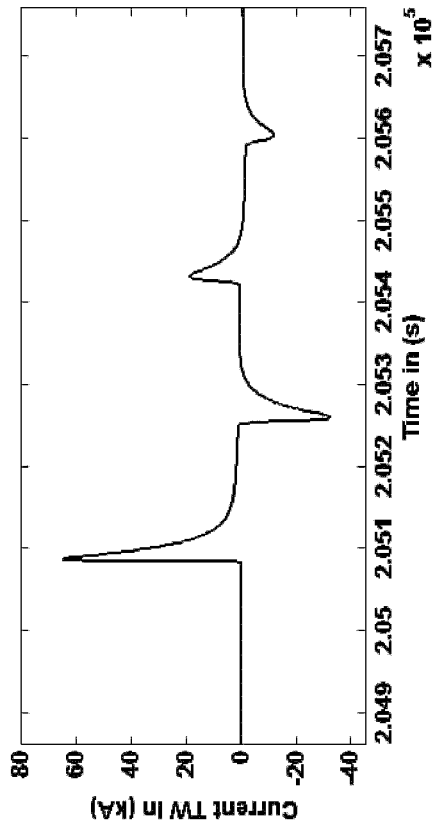

FIGS. 1(a) and 1(b) illustrate monitoring of traveling wave signals for a phase A to ground (A-g) fault with reference to phase A in (a) alpha mode and (b) beta mode, in accordance with an embodiment of the present subject matter. In one example, a phase to ground (A-g) fault is simulated at 25 km of the 150 km transmission line with a fault resistance of 20Ω and an inception angle of 60 degree. FIG. 1(a) depicts monitoring of traveling wave signals for a phase A to ground (A-g) fault in alpha mode for phase A and FIG. 1(b) depicts monitoring of traveling wave signals for a phase A to ground (A-g) fault in beta mode for phase A. As it may be observed, for a phase A to ground fault only the alpha mode signal with reference to phase A is present whereas the beta mode signal with reference to phase A is negligible. Further, beta mode signals with reference to phase B and phase C have significant magnitudes (not shown in the figure) when a phase A-g fault occurs. Similarly, for a phase B to ground (B-g) fault, the beta mode signal with phase B as reference is negligible and for a phase C to ground (C-g) fault, beta mode signal with phase C as reference is negligible. Further, as ground is involved in the fault, the magnitude of zero mode signal is not negligible for these faults.

Figure 2A:
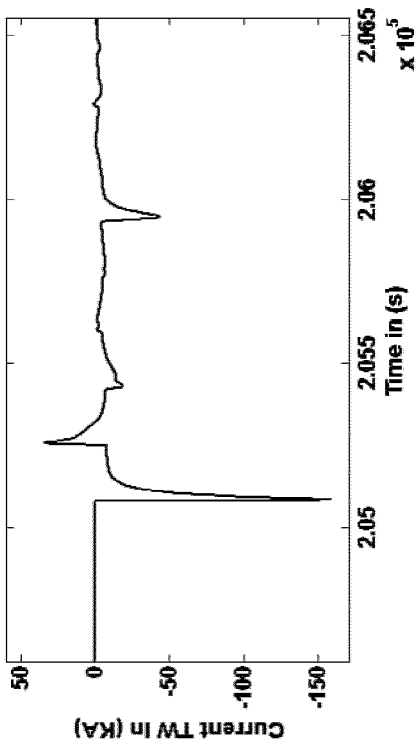
FIGS. 2(a) and 2(b) illustrate monitoring of traveling wave signals for a phase B to phase C (BC) fault with reference to phase A in (a) alpha mode and (b) beta mode, in accordance with an embodiment of the present subject matter.
Figure 2B:
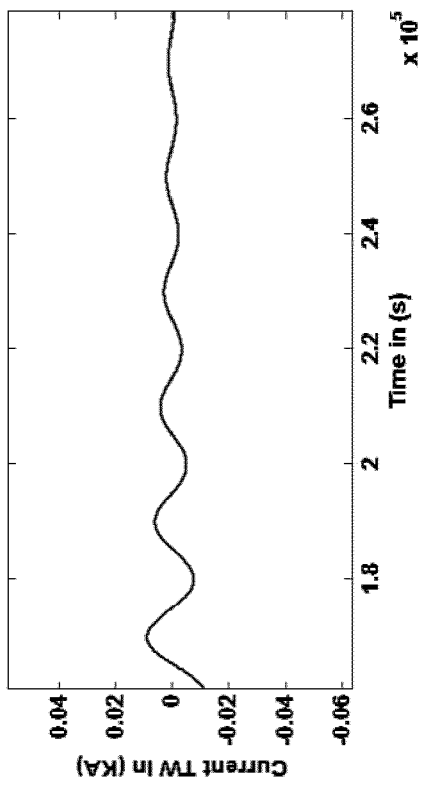

FIGS. 2(a) and 2(b) illustrate monitoring of traveling wave signals for a phase B to phase C (BC) fault with reference to phase A in (a) alpha mode and (b) beta mode, in accordance with an embodiment of the present subject matter. In one example, a phase to phase (phase B to phase C) fault is simulated at 25 km of the 150 km transmission line, with a fault resistance of 1Ω and inception angle of 60 degree. FIG. 2(a) depicts monitoring of traveling wave signals for a phase B to phase C (BC) fault in alpha mode for phase A and FIG. 2(b) depicts monitoring of traveling wave signals for a phase B to phase C (BC) fault in beta mode for phase A. For a phase B to phase C fault, it can be observed that an alpha mode signal estimated with reference to phase A is negligible, and it can be used for fault type identification. Similarly, for phase A to phase B and phase C to phase A faults, alpha mode signal with reference to phase C and phase B respectively are close to zero in magnitude. Also, since ground is not involved in the fault, magnitude of zero mode signal is negligible for these faults.

Figure 3A:
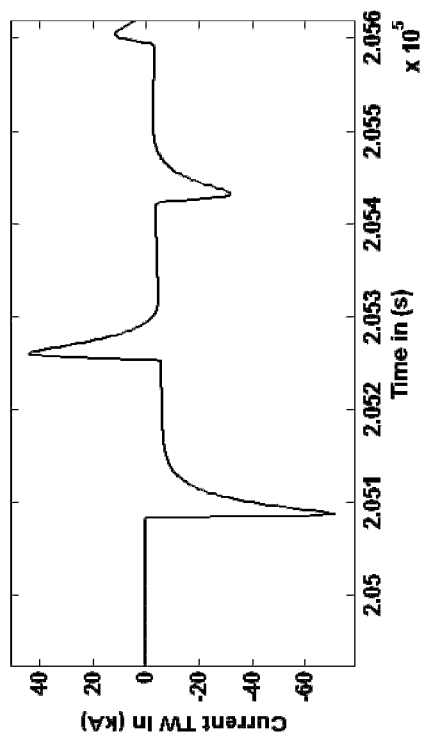
FIGS. 3(a) and 3(b) illustrate monitoring of traveling wave signals for a phase C to phase A to ground (CA-g) fault with reference to phase A in (a) alpha mode and in (b) beta mode, in accordance with an embodiment of the present subject matter.
Figure 3B:
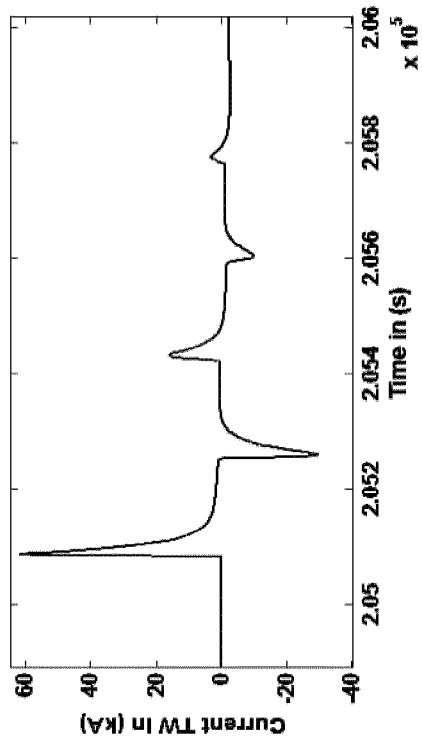

FIGS. 3(a) and 3(b) illustrate monitoring of traveling wave signals for a phase C to phase A to ground (CA-g) fault with reference to phase A in (a) alpha mode and in (b) beta mode, in accordance with an embodiment of the present subject matter. In one example, a phase to phase to ground (phase C to phase A to ground) fault is simulated at 25 km of the 150 km transmission line, with a fault resistance of 20Ω and inception angle of 60 degree. FIG. 3(a) depicts monitoring of traveling wave signals for a phase C to phase A to ground (CA-g) fault in alpha mode for phase A and FIG. 3(b) depicts monitoring of traveling wave signals for a phase C to phase A to ground (CA-g) fault in beta mode for phase A. For CA-g faults, both alpha and beta mode signals are available. However, magnitude of alpha mode signal estimated with phase B as reference is minimum, among the alpha mode signals calculated using all three phases as references. Also, since ground is involved in the fault, magnitude of zero mode signal is not negligible for these faults.

Figure 4A:
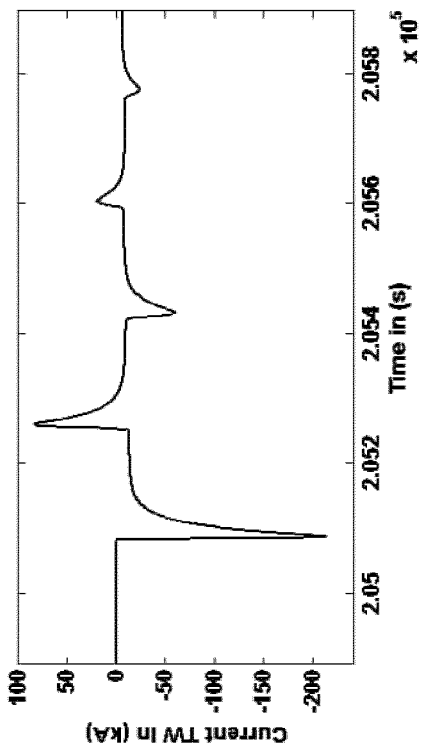
FIGS. 4(a) and 4(b) illustrate monitoring of traveling wave signals for a three phase to ground (ABC-g) fault case with reference to phase A in (a) alpha mode and (b) beta mode, in accordance with an embodiment of the present subject matter.
Figure 4B:
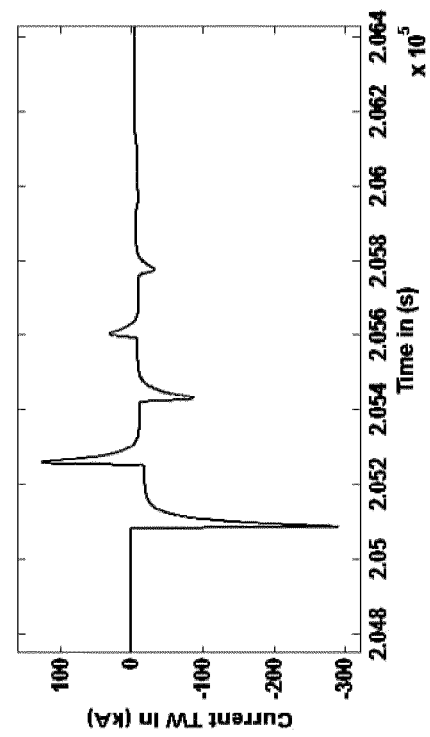

FIGS. 4(a) and 4(b) illustrate monitoring of traveling wave signals for a three phase to ground (ABC-g) fault case with reference to phase A in (a) alpha mode and (b) beta mode, in accordance with an embodiment of the present subject matter. In one example, a three phase to ground (ABC-g) fault is simulated at 25 km of the 150 km transmission line, with a fault resistance of 10Ω and inception angle of 60 degree. FIG. 4(a) depicts monitoring of traveling wave signals for a three-phase to ground (ABC-g) fault in alpha mode for phase A and FIG. 4(b) depicts monitoring of traveling wave signals for a three-phase to ground (ABC-g) fault in beta mode for phase A. As it can be observed from FIGS. 4(a) and 4(b) for a 3-phase to ground fault both alpha and beta mode signals are available.

Based on these observations, the present subject matter proposes a phase selection method based on traveling wave signal information for fast and reliable classification of faults as explained below.

Figure 5A:
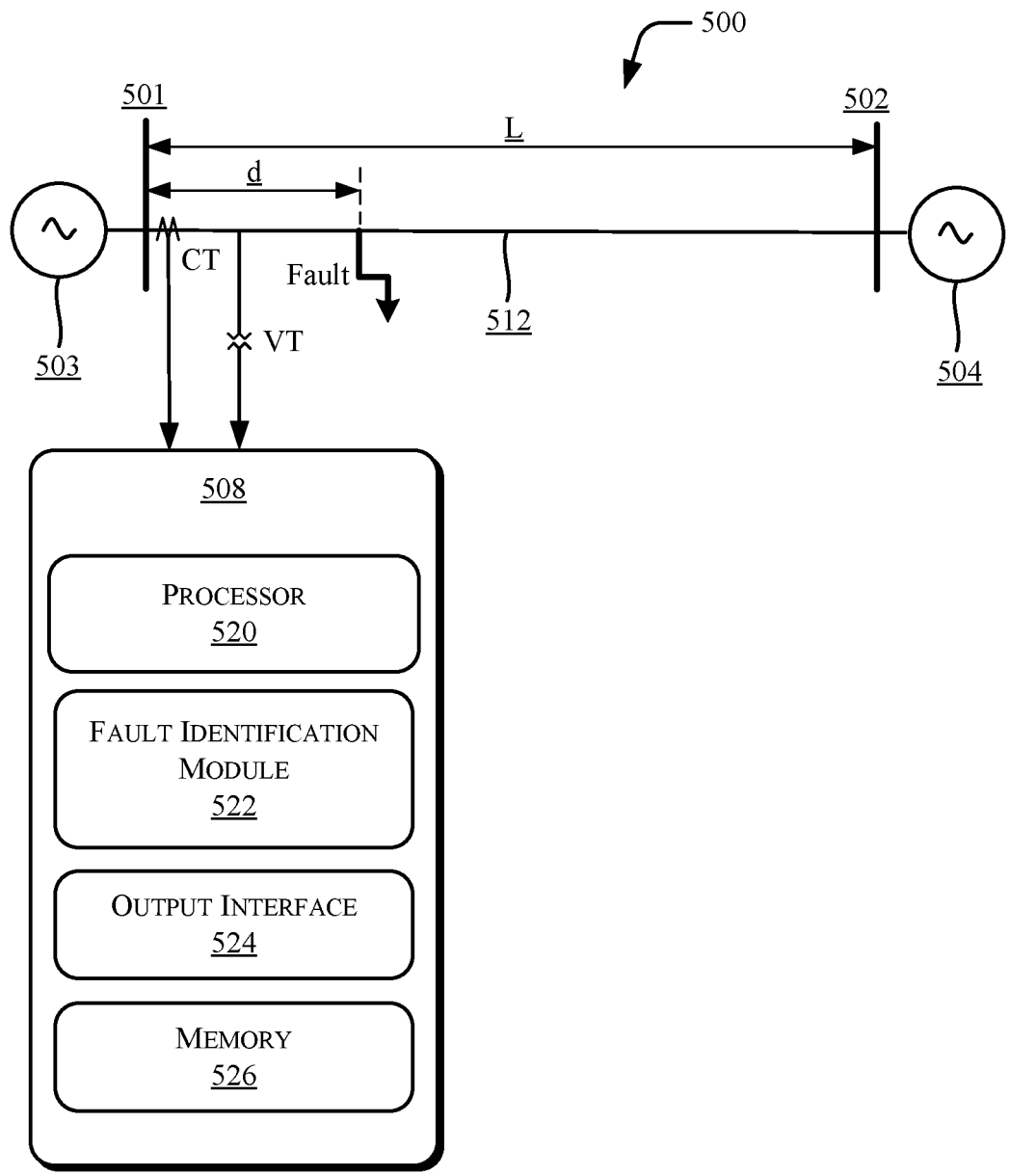
FIG. 5(a) illustrates a block diagram of a two-source equivalent electrical network to classify a fault, in accordance with an embodiment of the present subject matter.

FIG. 5(a) illustrates a block diagram of a two-source equivalent electrical network to classify a fault, in accordance with an embodiment of the present subject matter. A two-source equivalent electrical network 500 comprises a power transmission line 512 of length L connected between two terminals Bus M 501 and Bus N 502. Electrical power sources 503 and 504 supply power to Bus M 501 and Bus N 502 respectively. In one example, the sources 503 and 504 may be connected to power generators, such as a synchronous power generation resource, a grid connected transmission line, or an inverter-based power generation resource.

The electrical network 500 may transmit electric power at high voltages, such as in the range of kilovolts, and for long distances, such as for tens or hundreds of kilometres.

It will be understood that that the two-terminal system 500 for fault classification may include a plurality of additional components or devices for monitoring, sensing, and controlling various parameters that may be associated with the transmission lines but are not shown for brevity. For example, components such as circuit breakers, sensors, current transformers, voltage transformers, loads connected to the transmission lines, shunt reactors, intelligent electronic devices (LEDs), protective relays, and the like may be connected to the transmission line.

Further, a device 508 may be associated with the transmission line 512 for fault classification. For discussion, techniques for classification of the fault are described with reference to the device 508 implemented at terminal M 501. However, similar techniques can be applied by a device at terminal N 502 as may be understood.

In one example, the device 508 may be an intelligent electronic device (IED) In other examples, the device 508 may be any computing device, such as a server, a desktop device, a laptop, etc., which may receive the measurements from an TED. In an example, the present subject matter may be implemented by one or more modules. The modules may be implemented as instructions executable by one or more processors. For instance, in an example where the device 508 performs the method, the modules are executed by the processors of the device 508. In case the method is implemented in part by the device 508 and in part by a server, the modules (depending on the step) will be distributed accordingly in the device 508 and the server.

In operation, the device 508 may be configured to receive input measurement signals associated with Bus M 501, also referred to as first terminal, from various measurement equipment connected to the transmission line 512, such as current transformers, potential transformers, Rogowski coils, or other measurement sensors. For example, a voltage transformer depicted as VT and/or a current transformer depicted as CT may be used to obtain the input measurements. In one example, the device 508 may obtain voltage or current measurements or both voltage and current measurements associated with Bus M 501. The device 508 may be configured to detect a fault in a power transmission line using techniques known in the art. In response to that, the device 508 may be configured to classify the fault as further discussed below and may accordingly generate a trip signal to isolate the fault.

To classify the fault, the device 508 may process the obtained measurements with the help of a processor 520. The processor 520 may be implemented as a dedicated processor, a shared processor, or a plurality of individual processors, some of which may be shared. The device 508 may comprise a memory 526, that may be communicatively connected to the processor 520. Among other capabilities, the processor 520 may fetch and execute computer-readable instructions, stored in the memory 526. In one example, the memory 526 may store a fault classification module 522. In other examples, the fault classification module 522 may be external to the memory 526. The memory 526 may include any non-transitory computer-readable medium including, for example, volatile memory, such as RAM, or non-volatile memory, such as EPROM, flash memory, and the like.

Further, the device 508 may comprise an output interface 524 to communicate the results obtained from the fault classification module 522, for example, to a server. In one example, when the method is implemented at a server, the device 508 may communicate the current and voltage measurements to the server through the output interface 524. The output interface 524 may include a variety of computer-readable instructions-based interfaces and hardware interfaces that allow interaction with other communication, storage, and computing devices, such as network entities, web servers, databases, and external repositories, and peripheral devices. In one example, the fault classification, current and voltage measurements, and the like may be viewed on a display connected to the output interface 524 or integrated with the device 508.

In one example, on detecting a fault in the transmission line, the processor 520 of the device 508 may execute the fault classification module 522 to classify the fault. The fault classification module 522 may obtain voltage or current measurements at a terminal of the transmission in each of the three phases measured during the fault by measurement equipment associated with the transmission line. The voltage or current measurements may be obtained from a repository in the device 508 or an external device or repository.

The fault classification module 522 may then perform modal transformations on the voltage or current measurements to obtain traveling wave signals with reference to each of the three phases. The traveling wave signals include one or more of beta mode traveling wave signals, alpha mode traveling wave signals, and zero mode traveling wave signals with reference to each of the three phases. In one example, the modal transformation that may be performed is Clarkes transformation and the modal transformations may be performed at each phase, i.e., phase A, phase B, and phase C, to obtain respective alpha, beta, and zero mode traveling wave signals.

Figure 5C:
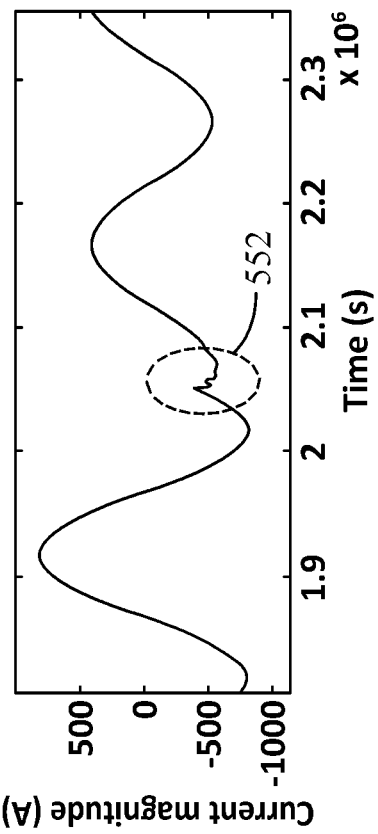
FIG. 5(c) illustrates an alpha component of the current signal for a phase A to ground fault at 50 km from bus M of a 150 km transmission line.
Figure 5B:
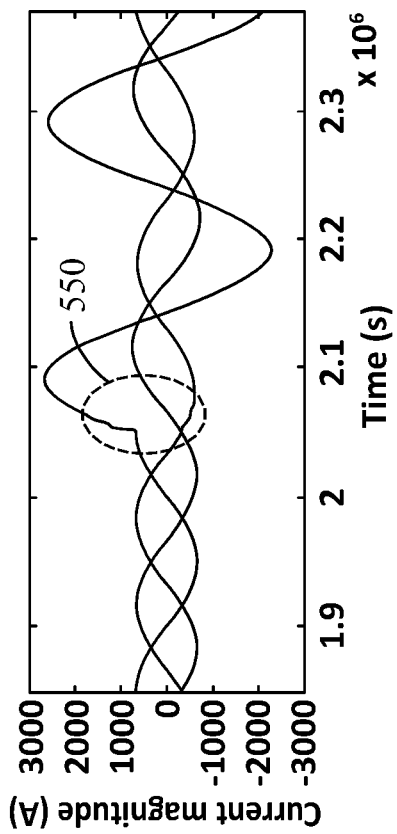
FIG. 5(b) illustrates three phase currents for a phase A to ground fault at 50 km from bus M of a 150 km transmission line.
Figure 5D:
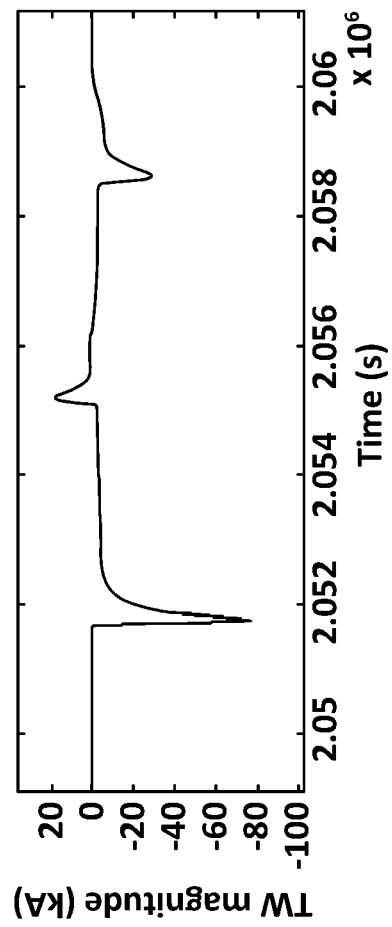
FIG. 5(d) illustrates an extracted traveling wave for a phase A to ground fault at 50 km from bus M of a 150 km transmission line.

In one example, the voltage or current measurements may be decomposed into two aerial mode signals (an alpha mode signal and a beta mode signal) and a ground mode signal. Decomposition of the phase voltage or phase currents into aerial and ground mode signals may be performed by Clarkes transformation. The aerial mode signals and the ground mode signal may be then passed through a band pass filter to extract traveling waves. For example, a phase A-to-ground fault at location of 50 km of 150 km transmission line is considered. FIG. 5(b) illustrates three phase currents for a phase A to ground fault at 50 km from bus M of a 150 km transmission line. FIG. 5(c) illustrates an alpha component of the current signal in phase A for a phase A to ground fault at 50 km from bus M of a 150 km transmission line. FIG. 5(d) illustrates an extracted alpha mode traveling wave in phase A for a phase A to ground fault at 50 km from bus M of a 150 km transmission line. The high frequency transient component (traveling waves) is represented by 550 in FIG. 5(b) and the high frequency transient component in the alpha mode signal is represented by 552 in FIG. 5(c), which is extracted by passing the alpha mode signal shown in FIG. 5(c) through a band pass filter to obtain the traveling wave shown in FIG. 5(d). Based on the magnitudes of the traveling wave signals, the fault may be classified. In one example, the fault classification may be performed without using an incremental quantity of the voltage or current measurements with reference to time. Further, based on the classification of the fault, a single-phase trip signal or a three-phase trip signal may be generated.

For the classification of the fault, the fault classification module 522 may compare a magnitude of zero mode traveling wave signals with a zero mode threshold value to differentiate a fault involving ground from a fault that does not involve ground. In one example, the zero mode threshold value may be 0.01. Further, on determining whether the fault involves ground or not and based on the magnitudes of alpha and beta mode traveling wave signals of the three phases A, B, and C, the fault may be classified as a single phase fault, a single phase to ground fault, a phase to phase fault, a phase to phase to ground fault, a three phase fault, or a three phase to ground fault.

In one example, when the fault involves ground, fault classification module 522 may classify the fault as involving a first phase of the three phases and ground when a first condition is satisfied. The first condition may be satisfied when the magnitude of beta traveling wave signal with reference to the first phase is a minimum of the magnitudes of beta traveling wave signals of each of the three phases and is less than a beta mode threshold value.

Further, when the fault involves ground, the fault classification module 522 may classify the fault as involving two phases of the three phases and the ground when a second condition is satisfied. The second condition may be satisfied when a magnitude of alpha traveling wave signal with reference to a third phase of the three phases is a minimum of the magnitudes of alpha traveling wave signals of each of the three phases. When the second condition is not satisfied but ground is involved, the fault classification module 522 may classify the fault as involving the three phases and the ground.

On the other hand, when the fault does not involve ground, that is, when the magnitude of zero mode traveling wave signal is less than the zero mode threshold value, the fault classification module 522 may classify the fault as involving two phases of the three phases when a third condition is satisfied. The third condition may be satisfied when the magnitude of alpha traveling wave signal with reference to a third phase of the three phases is a minimum of the magnitudes of alpha traveling wave signal of each of the three phases and is less than an alpha mode threshold value. When the third condition is not satisfied and ground is not involved, the fault classification module 522 may classify the fault as involving the three phases.

Figure 9:
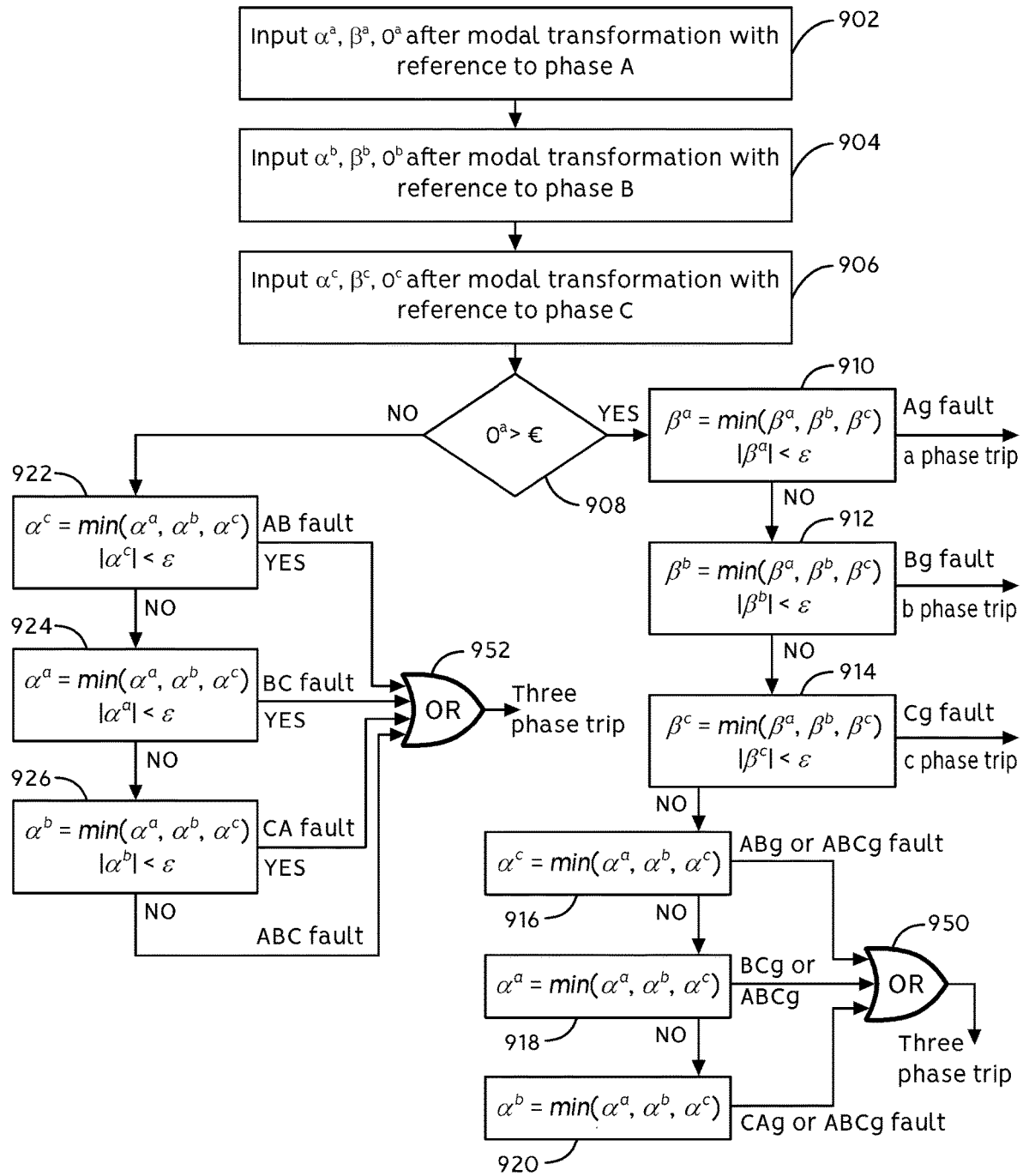
FIG. 9 illustrates a method for phase selection of the fault for fault classification, in accordance with an embodiment of the present subject matter.

The phase selection process for classifying the fault is described in further detail with respect to FIG. 9. Further, based on the classification, the fault classification module may generate a single phase trip signal or a three phase trip signal.

Figure 5E:
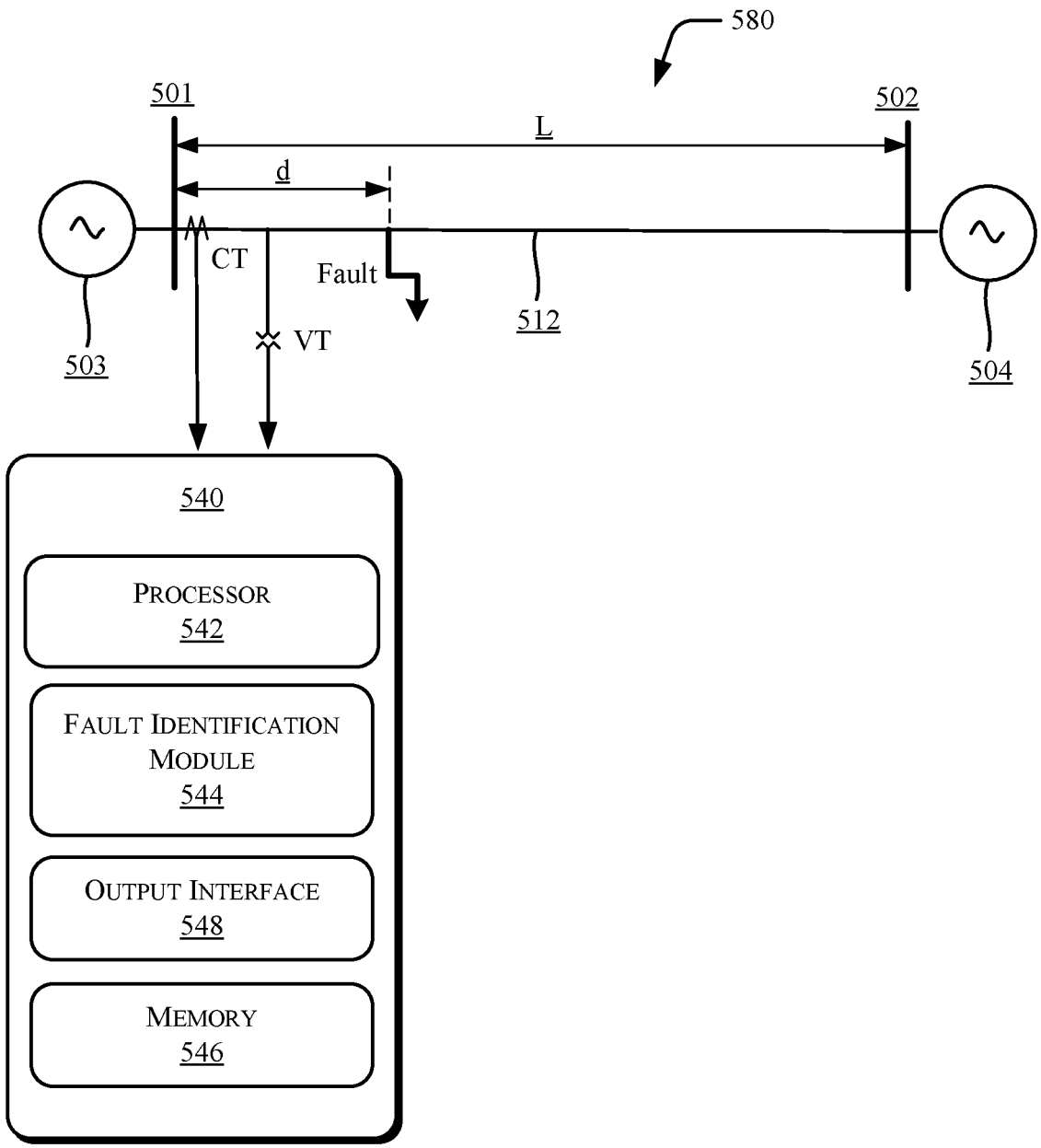
FIG. 5(e) illustrates a block diagram of a two-source equivalent electrical network to identify a zone in which a fault lies, in accordance with an embodiment of the present subject matter.

FIG. 5(e) illustrates a block diagram of a two-source equivalent electrical network to identify a zone in which a fault lies, in accordance with an embodiment of the present subject matter. In one example, once a fault is detected and classified, a segment in which the fault or a zone in which the fault may lie may be identified. In one example, the fault may be classified based on the classification technique as described with reference to FIG. 5(a) or any other fault classification technique may be used. In one example, the two-terminal system 580 for fault zone identification may be the similar to the two-terminal system 500 used for fault classification as discussed with reference to FIG. 5(a).

As shown in FIG. 5(e), a device 540 may be associated with the transmission line 512 for zone identification. The device 540, like the device 508, may be an intelligent electronic device or any computing device, such as a server, a desktop device, a laptop, etc., which may receive the measurements from an IED. In one example, the device 508 and the device 540 may be integrated in a single device to perform both fault classification and zone identification. Like the device 508, the device 540 may receive voltage and current measurements associated with Bus M 501 from various measurement equipment connected to the transmission line 512, such as current transformers, potential transformers, Rogowski coils, or other measurement sensors. Further, the device 540 may be configured to identify the zone in which the fault may be located. For zone identification, the device 540 may process the obtained measurements with the help of a processor 542, similar to processor 520.

In an example, the present subject matter may be implemented by one or more modules executed by the processor 542. The modules may be implemented as instructions executable by one or more processors. For instance, in the example where the device 540 performs the method, the modules are executed by the processors of the device 540. In case the method is implemented in part by the device 540 and in part by a server, the modules (depending on the step) will be distributed accordingly in the device 540 and the server.

The device 540 may comprise a memory 546, that may be communicatively connected to the processor 542. Among other capabilities, the processor 542 may fetch and execute computer-readable instructions, stored in the memory 546. In one example, the memory 546 may store a fault zone identification module 544. In other examples, the fault zone identification module 544 may be external to the memory 546. The memory 546 may include any non-transitory computer-readable medium including, for example, volatile memory, such as RAM, or non-volatile memory, such as EPROM, flash memory, and the like.

In one example, on detecting a fault in the transmission line, a method to identify a zone in which the fault may lie may be performed by the device 540. Further, the device 540 may comprise an output interface 548 to communicate the results obtained from the fault zone identification module 544, for example, to a server. In one example, when the method is implemented at a server, the device 540 may communicate the current and voltage measurements to the server through the output interface 548. The output interface 548 may include a variety of computer-readable instructions-based interfaces and hardware interfaces that allow interaction with other communication, storage, and computing devices, such as network entities, web servers, databases, and external repositories, and peripheral devices. In one example, the fault zone identification, the obtained current and voltage measurements, etc. may be viewed on a display connected to the output interface 548 or integrated with the device 540.

To identify a zone where the fault lies, the device 540 may be configured to receive an identification of a transmission line having the fault. For discussion, the method of identifying the fault zone, alternatively referred to as a fault segment, is described with reference to the device 540 implemented at terminal M 501. However, a similar method can be executed by a device at terminal N 502 as may be understood.

In operation, the device 540 may receive an indication that a fault is present in the transmission line 512. On receiving this indication, a line length of the transmission line 512 may be computed. In one example, the line length may be computed based on traveling wave signals obtained from modal transformations performed on voltage or current measurements determined at a terminal, such as terminal M 501, of the transmission line 512 during the fault. Further, a comparison between the actual line length and the computed line length may be used to identify a zone in which the fault lies.

In one example, the device 540 may identify a zone of the transmission line where the fault lies based on the traveling wave signals when a difference between the computed line length and an actual line length is less than a threshold line length. The zone identified based on the traveling wave signals may lie in a range of one-thirds to two-thirds of the actual line length from the terminal. In an example, the device 540 may identify the zone of the transmission line where the fault lies based on a rate of change of incremental terminal current with reference to time when the difference between the computed line length and the actual line length is greater than or equal to the threshold line length. The zone identified based on the rate of change of incremental terminal current may lie in a range of one-thirds of the actual line length from the terminal. Aspects of fault segment or fault zone identification are further explained in detail below with reference to FIGS. 6 and 7.

Figure 6:
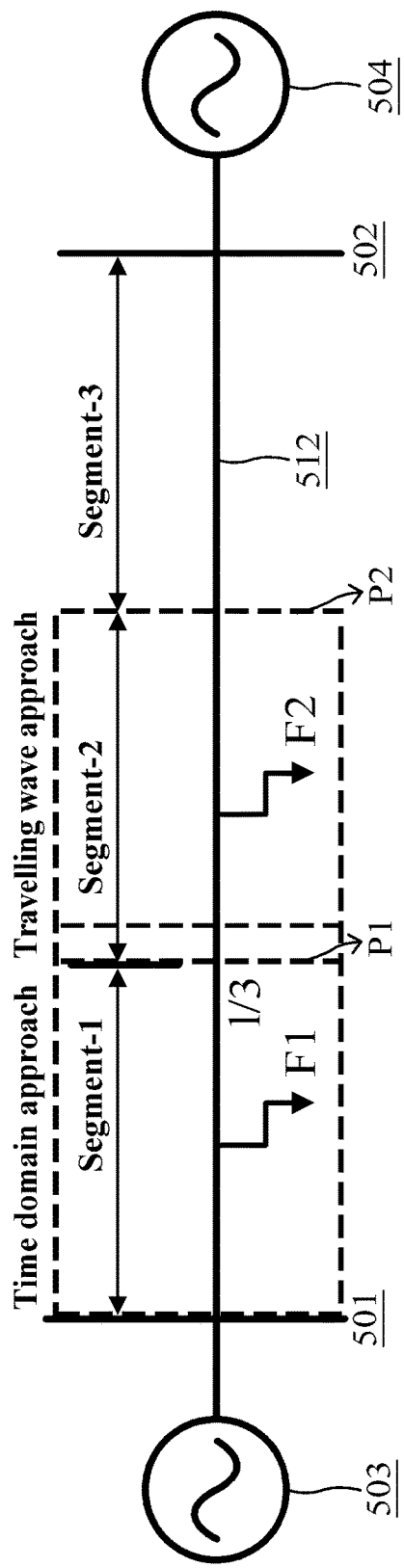
FIG. 6 illustrates a technique to identify if the detected fault is in a defined zone, in accordance with an embodiment of the present subject matter.

FIG. 6 illustrates a technique to identify if the detected fault is in a defined zone, in accordance with an embodiment of the present subject matter. It is observed that for faults very close to the local terminal, such as terminal 501 or 502, the time-domain approach may be implemented as it is fast and reliable. However, for these faults that occur close to the terminal, the traveling wave approach may be less reliable due to identification of multiple reflections and refractions. On the other hand, for faults that occur away from the local terminals, the time-domain approach may be slower and less reliable. In particular, for faults beyond 50% of the transmission line with inverter-based sources, the time domain approach may be less efficient in comparison to the traveling wave-based approach. The traveling wave-based approach has been found to work with very high speed and accuracy for the portion of the line between 33.3% to 66.67% as per the present subject matter. Hence, the present subject matter implements a hybrid approach that comprises the time domain approach and the traveling wave approach and thus ensures super-fast and highly reliable protection of the transmission line up to 66.67% of the total line length from a terminal.

In one example, the transmission line, such as transmission line 512, may be divided into three segments: segment-1, segment-2 and segment-3. In one example, segment-1 and segment-3 may be referred to as end segments as they may be adjacent to terminal ends and segment-2 may be referred to as mid-segment as it may include a mid-point of the transmission line. Segment-1 may cover the beginning of the line from the Bus M 501 to about 33.33% P1, that is, one-thirds of the transmission line from the terminal. Segment-2 covers from one-thirds (33.33%) P1 of the transmission line from the terminal 501 to two-thirds (66.67%) P2 of the transmission line from the terminal 501. Segment-3 covers from two-thirds 66.67% P2 of the transmission line from the terminal 501 to the terminal 502 of the transmission line, i.e., one-thirds of the transmission line from the terminal 502. In one example, a time-domain based zone identification approach may be implemented for protecting segment-1 of the transmission line and a traveling wave-based approach may be implemented for protecting segment-2 of the transmission line. As segment-3 corresponds to segment-1 when viewed from the terminal 502, segment-3 may also be protected using a time-domain based zone identification approach when the current or voltage measurements are obtained from the terminal 502. The present subject matter thus efficiently combines the merits of both the time domain based and traveling wave-based approaches to achieve fast and reliable zone identification.

Figure 7:
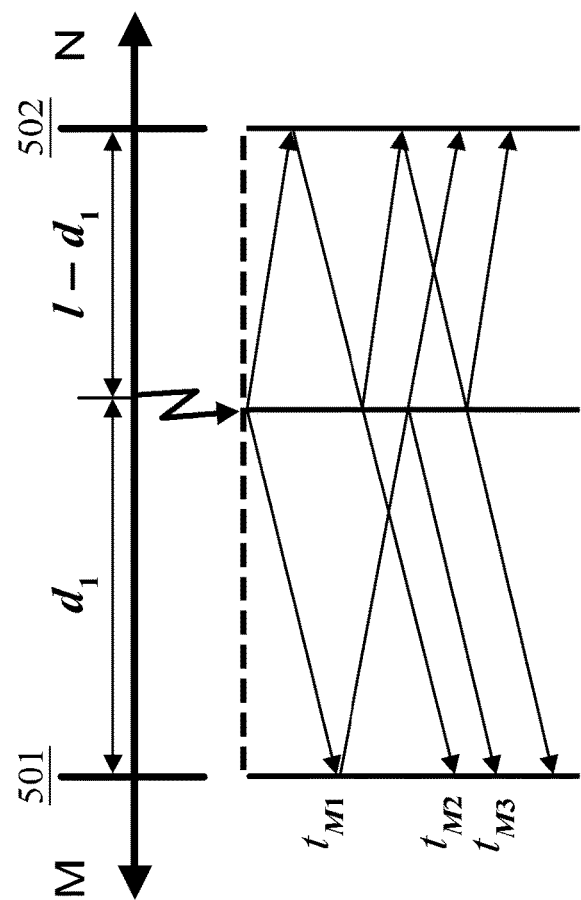
FIG. 7 illustrates a lattice diagram for the traveling wave-based approach for line length computation, in accordance with an embodiment of the present subject matter.

FIG. 7 illustrates a lattice diagram for the traveling wave-based approach for line length computation, in accordance with an embodiment of the present subject matter.

During the occurrence of a fault in the transmission line, a high frequency transient signal may be generated which may travel along the transmission line to nearest impedance discontinuity point in the interconnected power system with a velocity approximately equal to the velocity of light. From the point of impedance discontinuity, the wave may be reflected and refracted based on which a line length may be computed.

As discussed above, the portion of the transmission line between one-thirds and two-thirds (P1-P2) of the transmission line may be protected by the traveling wave-based approach. In one example, let us consider a fault in segment-2 of the transmission line and FIG. 7 represents the lattice diagram for the same.

For a fault in segment-2 ($\ell/3 < d_1 < 2\ell/3$) from lattice diagram shown in FIG. 7, we get the following equations at bus M, $$t_{M1} = t_{0M} + \frac{d_1}{v} \quad (1)$$

$$t_{M2} = t_{0M} + \frac{3d_1}{v} \quad (2)$$

$$t_{M3} = t_{0M} + \frac{2\ell - d_1}{v} \quad (3)$$

where,
$t_{M1}$ is the arrival time of the first wave at Bus M,
$t_{M2}$ is the arrival time of the second wave at Bus M,
$t_{M3}$ is the arrival time of the third wave at Bus M,
$t_{0M}$ is the fault inception time,
$\ell$ is the length of the transmission line
v is the propagation velocity and
$d_1$ is the fault location.

The line length may be calculated as depicted in equation (4) using based on equations (1-3) for the faults in segment-2 of the transmission line.

$$\ell_{cal} = [(t_{M2} - t_{M1}) + (t_{M3} - t_{M1})]\frac{v}{2} \quad (4)$$

Where,
$\ell_{cal}$ is the computed line length

In one example, the fault zone identification module 544 may be configured to compare the computed line length with the actual known line length. It will be understood that other techniques of computing line length may be used in other implementations. In one example, the actual known line length may be stored in the memory 546. Further, the fault may be identified to lie in segment-2 when the difference between the computed line length and the actual line length is less than a threshold line length. However, when the difference between the computed line length and the actual line length is more than a threshold line length the time domain approach may be used.

The present subject matter hence provides a fast and reliable fault classification system based on traveling wave approach and a hybrid solution based on incremental time domain and traveling wave principle to identify the segment (zone) in which the fault lies.

FIG. 8(*a*), FIGS. 8(*b*), 9, and 10 illustrate methods for classifying a fault, identifying a zone in which a fault lies, phase selection of the fault, and zone identification of the fault, in accordance with various embodiments of the present subject matter. The order in which methods 800, 801, 900, 1000 are described is not intended to be construed as a limitation, and some of the described method blocks may be performed in a different order to implement the methods 800, 801, 900, 1000 or an alternative method. Furthermore, the methods 800, 801, 900, 1000 may be implemented in any suitable hardware, computer readable instructions, firmware, or combination thereof. For discussion, the methods 800, 801, 900, 1000 are described with reference to the implementations illustrated in FIG. 5(a) and FIG. 5(e).

Figure 8A:
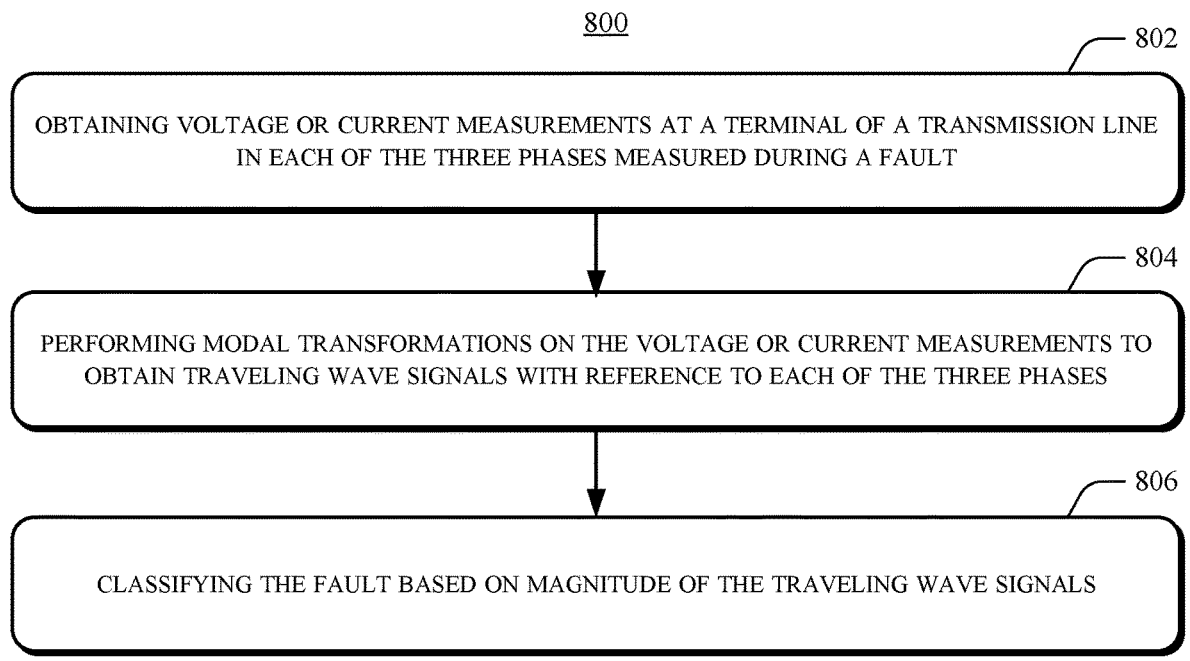
FIG. 8(a) illustrates a method for classifying a fault, in accordance with an embodiment of the present subject matter.

FIG. 8(a) illustrates a method 800 for classifying a fault, in accordance with an embodiment of the present subject matter. In the method 800, at block 802, voltage or current measurements are obtained at a terminal of the transmission line in each of the three phases measured during a fault. In one example, the terminal may be connected to a synchronous power generation resource or a grid connected transmission line or an inverter-based power generation resource. In one example, the voltage measurement for each phase at the terminal of the power transmission system may be obtained by a voltage transformer or a potential transformer, and the current measurement for each phase at the terminal of the power transmission system may be obtained by a current transformer. In one example, the current transformers and voltage transformers may be operationally connected to a device at terminal M 501.

At block 804, modal transformations are performed on the voltage or current measurements with reference to each of the three phases to obtain traveling wave signals. In one example, Clarkes transformation, a method well known in the art, may be performed on the voltage or current measurements with reference to phase A, phase B, and phase C, and subsequently alpha, beta, and zero mode traveling wave signals may be obtained with reference to each of the three phases as discussed above with reference to FIGS. 5(a)-5(d).

At block 806, the fault is classified based on the magnitude of the traveling wave signals. In one example, the fault may be classified as a single phase fault, a double phase fault, or a three phase fault, with or without involving ground. The classification of the fault and phase selection is explained in detail with reference to FIG. 9. Based on the classification of fault, a single-phase trip or a three-phase trip signal may be generated.

In one example, a magnitude of the zero mode traveling wave signals may be compared with a zero mode threshold value to differentiate a fault involving ground from a fault that does not involve ground.

In one example, when the fault involves ground, the fault may be classified as involving a first phase of the three phases and ground when a first condition is satisfied. The first condition may be satisfied when a magnitude of beta traveling wave signal with reference to the first phase is a minimum of the magnitudes of beta traveling wave signals of each of the three phases and is less than a beta mode threshold value.

In an example, when the fault involves ground, the fault may be classified as involving two phases of the three phases and the ground when a second condition is satisfied. The second condition may be satisfied when a magnitude of alpha traveling wave signal with reference to a third phase of the three phases is a minimum of the magnitudes of alpha traveling wave signals of each of the three phases. Further, when the first and second conditions are not satisfied, and the fault involves ground, the fault may be classified as involving the three phases and the ground.

In another example, when the fault does not involve ground, the fault may be classified as involving two phases of the three phases when a third condition is satisfied. The third condition may be satisfied when the magnitude of alpha traveling wave signal with reference to a third phase of the three phases is a minimum of the magnitudes of alpha traveling wave signals of each of the three phases and is less than an alpha mode threshold value. Further, when the third condition is not satisfied, and the fault does not involve ground, the fault may be classified as involving the three phases.

In one example, based on the fault classification as discussed above, a trip signal may be generated to cause a single-phase trip or three phase trip based on the classification of the fault. In one example, the fault classification module 522 of the device 508 may be configured to classify the fault.

Figure 8B:
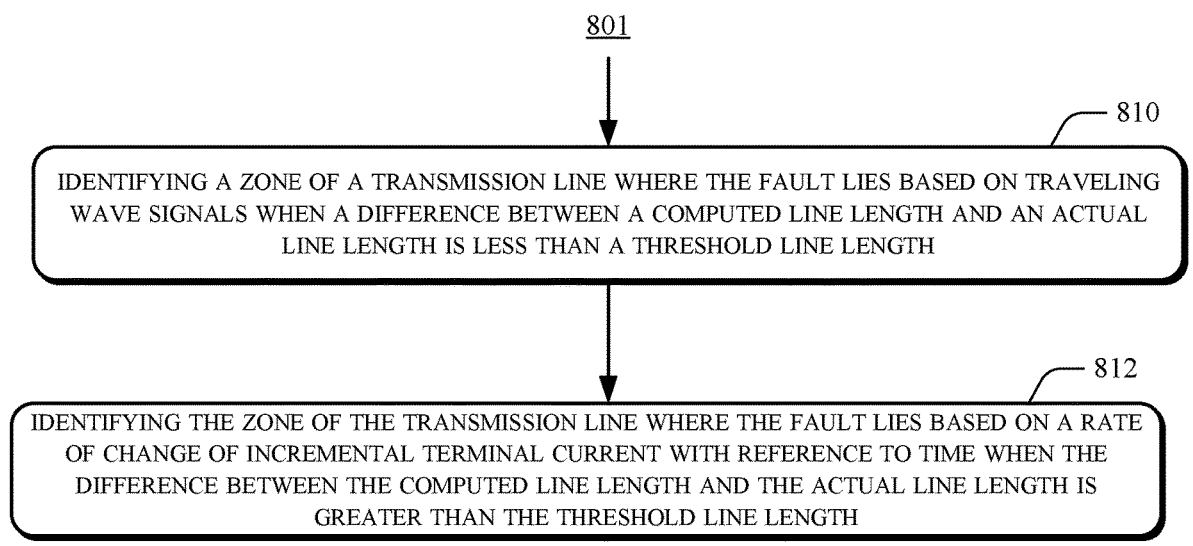
FIG. 8(b) illustrates a method for identifying a zone where the fault lies, in accordance with an embodiment of the present subject matter.

FIG. 8(b) illustrates a method 801 for identifying a zone where the fault lies, in accordance with an embodiment of the present subject matter. In the method 801 at block 810, a zone of a transmission line where the fault lies may be identified based on traveling wave signals when a difference between a computed line length and an actual line length is less than a threshold line length. Further, at block 812, the zone of the transmission line where the fault lies may be identified based on a rate of change of incremental terminal current with reference to time when the difference between the computed line length and the actual line length is greater than or equal to the threshold line length. In one example, determining the zone of the transmission line where the fault lies based on a rate of change of incremental terminal current with reference to time involves calculating an actual rate of change of incremental terminal current based on the current measurement.

In one example, the zone identified based on the traveling wave signals lies in a range of one-thirds to two-thirds of the actual line length from the terminal. Further, the zone identified based on the rate of change of incremental terminal current lies in a range of one-thirds of the actual line length from the terminal.

FIG. 9 illustrates a method 900 for phase selection of the fault for fault classification, in accordance with an embodiment of the present subject matter. Phase selection may be performed based on traveling wave principle as discussed above. At block 902, alpha, beta, and zero mode signals may be generated on performing modal transformation with reference to phase A on the voltage or current measurements obtained at the terminal. Similarly, at block 904, alpha, beta, and zero mode signals may be generated on performing modal transformation with reference to phase B on the voltage or current measurements obtained at the terminal and at block 906, alpha, beta, and zero mode signals may be generated on performing modal transformation with reference to phase C on the voltage or current measurements obtained at the terminal. In one example, the modal transformations performed with reference to phase A, phase B, and phase C may be Clarkes transformations.

At block 908, zero-mode signal of each phase may be compared with a zero mode threshold value. The comparison of the zero mode threshold value with the magnitude of the zero-mode signal may be used to determine whether the fault involves ground or not. In one example, the zero mode threshold value may be 0.01. Although block 908 depicts that zero-mode reference signal with reference to phase A is used for comparison for the ease of representation, it may be understood that the same comparisons may be made for zero mode signals of phase B and phase C.

When the magnitude of the zero-mode signal is greater than the zero mode threshold value, the fault may be classified as a phase to ground fault, a phase to phase to ground fault, or a three-phase to ground fault based on one or more conditions being satisfied.

At block 910, when the magnitude of beta traveling wave signal with reference to phase A is a minimum of the magnitudes of beta traveling wave signals with reference to the three phases-phase A, phase B, and phase C, and the magnitude of beta traveling wave signal with reference to phase A is less than a beta mode threshold value, the fault may be classified as phase A to ground fault. Accordingly, a single phase trip signal may be generated to trip phase A.

At block 912, when the magnitude of beta traveling wave signal with reference to phase B is a minimum of the magnitudes of beta traveling wave signals with reference to the three phases-phase A, phase B, and phase C, and the magnitude of beta traveling wave signal with reference to phase B is less than a beta mode threshold value, the fault may be classified as phase B to ground fault. Accordingly, a single phase trip signal may be generated to trip phase B.

Similarly, at block 914, when the magnitude of beta traveling wave signal with reference to phase C is a minimum of the magnitudes of beta traveling wave signals with reference to the three phases-phase A, phase B, and phase C and the magnitude of beta traveling wave signal with reference to phase C is less than a beta mode threshold value, the fault may be classified as phase C to ground fault. Accordingly, a single phase trip signal may be generated to trip phase C.

At block 916, when the magnitude of alpha traveling wave signal with reference to phase C is a minimum of the magnitudes of alpha traveling wave signals with reference to the three phases phase A, phase B, and phase C, the fault may be classified as phase to phase to ground fault between phase A, phase B, and ground or three-phase to ground (ABC-g) fault. Accordingly, a three phase trip signal may be generated.

At block 918, when the magnitude of alpha traveling wave signal with reference to phase A is a minimum of the magnitudes of alpha traveling wave signals with reference to the three phases phase A, phase B, and phase C, the fault may be classified as phase to phase to ground fault between phase B, phase C, and ground or three-phase to ground (ABC-g) fault. Accordingly, a three phase trip signal may be generated.

At block 920, when the magnitude of alpha traveling wave signal with reference to phase B is a minimum of the magnitudes of alpha traveling wave signals with reference to the three phases phase A, phase B, and phase C, the fault may be classified as phase to phase to ground fault between phase C, phase A, and ground or three-phase to ground (ABC-g) fault. Accordingly, a three phase trip signal may be generated.

In one example, the fault classifications generated at blocks 916, 918 and 920 may be sent to an OR gate 950 for generation of a three phase trip signal. To ensure safety and reduced damages, when a fault occurs between two phases or more the three-phase trip signal may be generated.

Referring back to block 908, when the fault does not involve ground, i.e., when the magnitude of any of the zero mode traveling signals is not greater than the zero mode threshold value, the method 900 proceeds to block 922. At block 922, when the magnitude of alpha traveling wave signal with reference to phase C is a minimum of the magnitudes of alpha traveling wave signals with reference to the three phases phase A, phase B, and phase C and the magnitude of alpha traveling wave signal with reference to phase C is less than an alpha mode threshold value, the fault may be classified as phase-phase fault between phase A and phase B.

At block 924, when the magnitude of alpha traveling wave signal with reference to phase A is a minimum of the magnitudes of alpha traveling wave signals with reference to the three phases phase A, phase B, and phase C and the magnitude of alpha traveling wave signal with reference to phase A is less than an alpha mode threshold value, the fault may be classified as phase-phase fault between phase B and phase C.

Similarly, at block 926, when the magnitude of alpha traveling wave signal with reference to phase B is a minimum of the magnitudes of alpha traveling wave signals with reference to the three phases phase A, phase B, and phase C and the magnitude of alpha traveling wave signal with reference to phase B is less than an alpha mode threshold value, the fault may be classified as phase-phase fault between phase C and phase A.

When the condition at any one of the blocks 922, 924 and 926 is not satisfied, the fault may be classified as a three phase (ABC fault). In either case, i.e., whether the fault is a two phase fault or a three phase fault, a three phase trip signal may be generated. In one example, all the fault classifications generated from blocks 922, 924, and 926 may be sent to an OR gate 952 based on which a final three phase trip signal may be generated. To ensure safety and reduced damages, when a fault occurs between two phases or more a three-phase trip signal may be generated.

Figure 10:
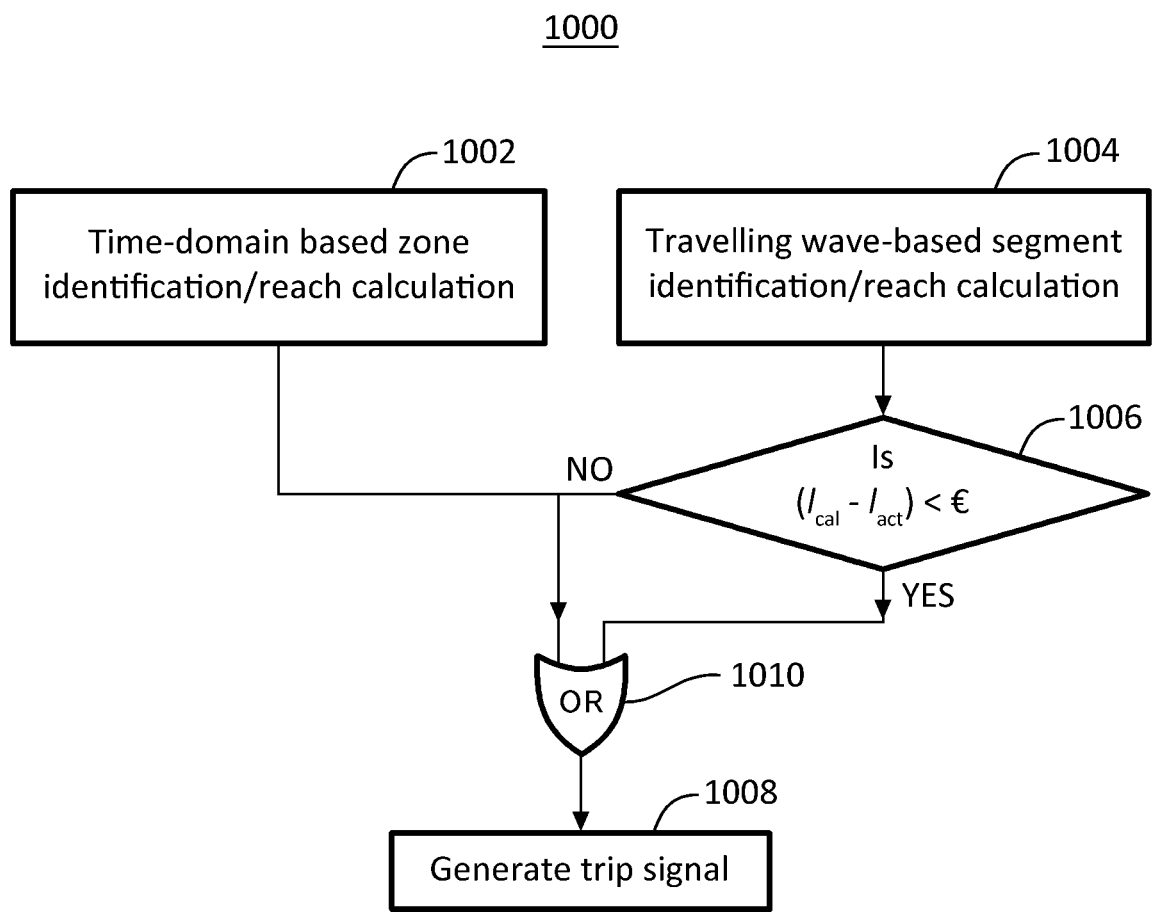
FIG. 10 illustrates a method to identify a zone in which a detected fault lies, in accordance with an embodiment of the present subject matter.

FIG. 10 illustrates a method 1000 to identify a zone in which a detected fault lies, in accordance with an embodiment of the present subject matter. As discussed above on classifying a fault, the segment in which the fault may have occurred may be determined. In one example, the fault classification may be performed using the methods as discussed above with reference to FIG. 8(*a*) and FIG. 9. In another example, any method of fault classification known in the art may be performed.

In one example, the transmission line may be divided into three segments, segment-1, segment-2 and segment-3 as discussed with reference to FIG. 6. On classifying the fault, a hybrid time-domain based and traveling wave approach may be used to find the fault segment and generate a trip signal. For faults very close to the local terminal, the time-domain approach may be implemented as it is fast and reliable while traveling wave-based approach may be used with very high speed and accuracy for the segment lying in one-thirds to two-thirds of the transmission line. Both the time domain approach and the traveling wave approach based computations are performed simultaneously and based on the computations, the fault segment may be identified.

At block 1002, a time-domain based approach may be implemented where the reach (segment in which the fault lies) may be set to one-thirds of the actual line length of the transmission line. For implementing the time-domain approach the rate of change of incremental terminal current with respect to time is monitored. A threshold rate of change of incremental terminal current is calculated by assuming that the fault is at the segment-1 boundary. Further, the actual rate of change of incremental terminal current is calculated based on the current measurement obtained from the terminal. When the actual rate of change of incremental terminal current is greater than the threshold rate of change of incremental terminal current, the fault may be identified to be within the segment-1 and zone identification may be provided for trip signal generation. Alternately, if the actual rate of change of incremental terminal current is less than the threshold rate of change of incremental terminal current, the fault may be identified to be beyond segment-1 and no zone identification may be provided from block 1002.

At block 1004, a traveling-based approach may be implemented where the arrival times of the first, second, and third traveling waves at the terminal M are recorded. Based on parameters such as arrival times and propagation velocity the line length may be computed as depicted in equation (4) above.

At block 1006, the computed line length is compared with the actual known line length and when the difference is less than a threshold line length, then the fault is identified to be in segment-2 of the transmission line, and a fault zone identification is provided from block 1006. However, when the difference is not less than a threshold line length, no fault zone identification is provided from block 1006. In one example, the threshold value may be set depending on the sampling frequency. For a sampling rate of 1 MHz, the threshold value may be set to 300 m.

The fault zone identifications from block 1002 and 1006 may be sent to an OR gate 1010 (a combinational logic gate) to generate a final trip signal. When the OR gate 1010 receives a trip signal from either block 1002 or block 1006, it sends the signal to block 1008 where, the trip signal may be generated accordingly.

The above method of segment identification may be illustrated with the following example considering a fault is identified to be a single phase to ground (A-g) fault. On classifying the fault as phase A to ground fault, the zone identification using the time domain approach as well as the traveling wave approach is performed. If the time domain approach issues a zone identification signal before the traveling wave approach, the fault may be identified to be located in the end segment (first one-thirds of the line length) and if the traveling wave approach issues the trip signal prior to the time domain approach, the fault may be identified to be located in the mid-segment (middle one-thirds of the line segment) of the transmission line from the terminal at which the current or voltage measurements are obtained.

The present subject matter hence provides a fast and reliable fault classification technique based on the traveling wave principle and identifies the segment in which the fault may be located based on a hybrid time domain and traveling wave approach.

EXAMPLES

Different fault scenarios of different type of faults, different values of fault resistance, source to line impedance ratios, fault locations, with traditional sources and inverter-based resources were simulated and tested to determine the performance of the fault classification and hybrid method.

In a first scenario, the system was tested for transmission line system with traditional generators for a 400 kV, 50 Hz transmission line of length 200 kilometres.

In a first example, a single phase to ground A-g fault at 10% of line with a fault resistance 5 ohms and fault inception time of 0.1 seconds was considered. The time domain approach and the hybrid approach were tested.

FIG. 11 depicts, in the first example of the first scenario, the plot of threshold and actual rate of change of incremental currents for fault zone identification by the time domain approach. Line 1102 of the plot represents the actual rate of change of current and Line 1104 of the plot represents the threshold rate of change of current. It was observed that phase selection using the time-domain based approach takes about 3.17 ms to identify the fault type as phase A to ground fault. Further, it was observed that the time domain-based zone identification takes 1.87 ms to identify that the fault is within zone-1.

(a) and 12 (b) illustrate, in the first example of the first scenario, the first peaks of beta and zero mode traveling wave signals recorded at bus M, in accordance with an embodiment of the present subject matter. FIG. 12(a) illustrates traveling wave signals for A-g fault in beta mode. Line 1202 depicts beta mode signal with reference to phase C and Line 1204 depicts beta mode signal with reference to a phase A. Here, it may be observed that Line 1204 of phase A is minimum and has a negligible magnitude of 6.09e-9. FIG. 12(b) illustrates traveling wave signal for zero mode signal represented by Line 1206. As Line 1206 shows that the zero-mode signal has significant magnitude, it is concluded that the fault involves ground and that the fault is classified as phase A to ground A-g fault. When phase selection using traveling wave-based approach was used it was observed that the time taken for phase selection to identify the fault type as phase A to ground was 34 μs.

FIG. 13 illustrates, in the first example of the first scenario, traveling wave signals recorded at bus M depicting the first three peaks and their arrival times, in accordance with an embodiment of the present subject matter. For fault inception at 0.1 s, the first three peaks and traveling wave signals recorded at terminal M were used to calculate the line length based on equation (4) as discussed above. On using equation (4), the computed line length was determined to be 59.99 km which was very different from the actual line length of 200 km. Hence, no trip signal was generated based on the traveling wave-based approach. Rather, the time-domain approach is used for zone identification (after phase selection by the traveling wave approach) and generating the trip signal by the hybrid approach. Table 3 provides a comparative study of the operating times for the conventional time-based approach and the hybrid approach.

TABLE 3

COMPARISON OF OPERATING TIMES OF TIME-DOMAIN BASED AND HYBRID APPROACH

| | Conventional time-domain solution | Hybrid approach |
|---|---|---|
| Phase selection time | 3.17 ms | 34 μs |
| Zone identification time | 1.87 ms | 1.87 ms |
| Final trip time | 3.17 ms | 1.87 ms |

From Table 3, it can be observed that for a fault in segment-1 (0 to ⅓rd) of the transmission line, the time-domain based approach alone takes 3.17 ms to generate the final trip signal. This time comes from the operating time of phase selection module as the phase selection and zone identification are done in parallel. Whereas, in the hybrid approach, the traveling wave-based phase selection gives a phase selection signal within 34 μs and the time-domain portion of the zone identification approach generates the trip signal within 1.87 ms (the zone identification is done by time domain approach as the traveling wave approach does not accurately identify the zone). The final trip time is thus 1.87 ms in the hybrid method. Hence, the hybrid solution renders faster operation compared to time-domain approach.

In a second example, a phase to phase BC fault at 66% of line with a fault resistance 50 ohms and fault inception time of 0.095 seconds was considered. The conventional time domain-based approach and the hybrid method with a combination of time-domain based approach and traveling wave-based approach were tested.

FIG. 14 depicts, in the second example of the first scenario, the plot of threshold and actual rate of change of incremental currents for fault zone identification. Line 1402 of the plot represents the actual rate of change of current and Line 1404 of the plot represents the threshold rate of change of current. As it can be observed from the plot, the actual rate of change of current Line 1402 does not cross the threshold rate of change of current Line 1404 and hence the trip signal is not generated. It was observed that phase selection using time-domain based approach takes about 4.58 ms to identify the fault type as a phase B to phase C fault. Further, it was observed that the time domain-based zone identification does not generate a trip signal.

FIGS. 15 (*a*) and 15 (*b*) illustrate, in the second example of the first scenario, the first peaks of alpha and zero mode traveling wave signals recorded at bus M, in accordance with an embodiment of the present subject matter. FIG. 15(*a*) illustrates traveling wave signals for BC fault in alpha mode. Line 1502 depicts alpha mode signal with reference to phase C and Line 1504 depicts alpha mode signal with reference to a phase A. Here, it may be observed that Line 1504 is minimum and has a negligible magnitude of 11.9e-10. FIG. 15(*b*) illustrates traveling wave signal for zero mode signal represented by Line 1506 having a negligible magnitude of the order of 1e-13. As Line 1506 shows that the zero-mode signal has negligible magnitude, it is concluded that the fault does not involve ground and that the fault is classified as phase B to phase C fault. In this case, when phase selection using traveling wave-based approach was used it was observed that the time taken for phase selection to identify the fault type as phase B to phase C fault was 36 μs.

FIG. 16 illustrates, in the second example of the first scenario, traveling wave signals recorded at bus M depicting the first three peaks and their arrival times, in accordance with an embodiment of the present subject matter. For fault inception at 0.095 s, the first three peaks and traveling wave signals recorded at terminal M were used to calculate the line length based on equation (4) as discussed above. On using equation (4), the computed line length was determined to be 199.98 km which was very close to the actual line length of 200 km. Hence, a trip signal was generated based on the traveling wave-based approach (of the hybrid method) at approximately 0.14 ms. Table 4 provides a comparative study of the operating times for the conventional time-based approach and the hybrid approach.

TABLE 4

COMPARISON OF OPERATING TIMES OF TIME-DOMAIN BASED AND HYBRID APPROACH

|  | Conventional time-domain solution | Hybrid approach |
| --- | --- | --- |
| Phase selection time | 4.58 ms | 34 μs |
| Zone identification time | No Trip | 0.14 ms |
| Final trip time | No Trip | 0.14 ms |

From Table 4, it can be observed that for a fault in segment-2 ($1/3^{rd}$ to $2/3^{rd}$) of the transmission line, the time-domain algorithm alone fails to generate a trip signal. However, in the hybrid approach, the traveling wave-based phase selection gives a phase selection signal within 34 μs and traveling wave-based zone identification approach generates the trip signal within 0.14 ms. The final trip time is thus 0.14 ms in the hybrid method. This example demonstrates that the solution generates the trip signal with increased speed, even when the time-domain approach fails. Thus, hybrid solution increases reliability with high fault resistances and fault location at one-thirds to two-thirds of the line compared to time-domain approach.

In a second scenario, the system was tested for transmission line system with weak inverter-based sources for a 220 kV, 50 kilometres single circuit transmission line with source to line impedance ratio of 30:5.

In a first example, a single phase to ground A-g fault at 32% of line with a fault resistance 5 ohms and fault inception time of 0.3 seconds was considered. The time domain approach and the hybrid approach were tested.

Figure 17:
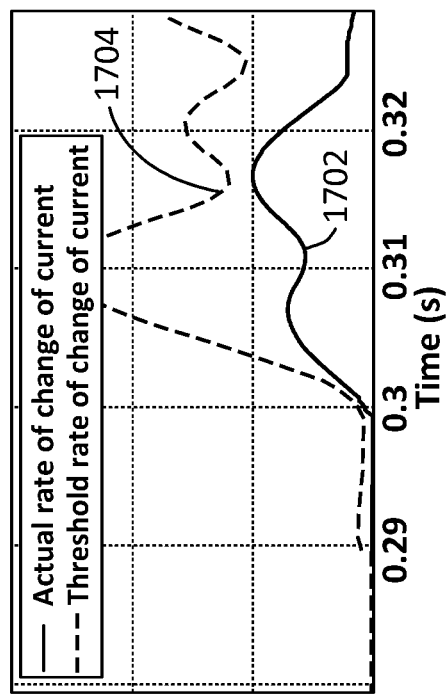
FIG. 17 depicts in a first example of a second scenario, the plot of threshold and actual rate of change of incremental currents for fault zone identification.

FIG. 17 depicts in the first example of the second scenario, the plot of threshold and actual rate of change of incremental currents for fault zone identification. Line 1702 of the plot represents the actual rate of change of current and Line 1704 of the plot represents the threshold rate of change of current. As it can be observed from the plot, the actual rate of change of current Line 1702 does not cross the threshold rate of change of current Line 1704 and hence the trip signal is not generated. It was observed that phase selection using the time-domain based approach was unable to identify the accurate fault loop based on current signals. Further, it was observed that the time domain-based zone identification takes 17.5 ms to identify that the fault in within zone-1 and generate a trip signal.

Figure 18A:
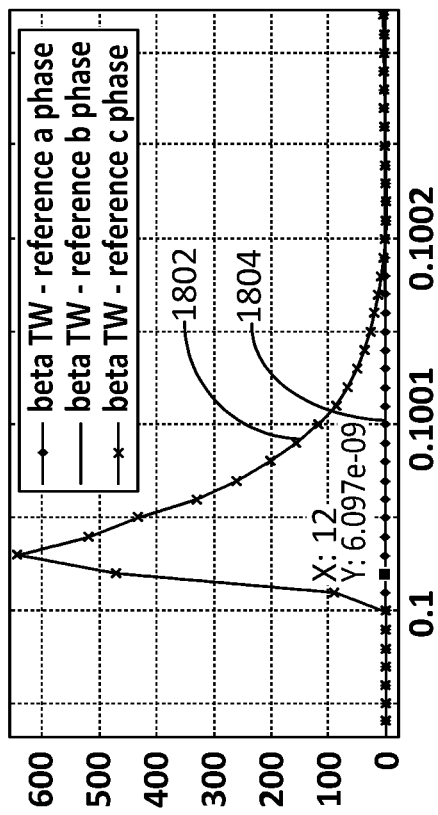
FIGS. 18 (a) and 18 (b) illustrate, in a first example of a second scenario, the first peaks of beta and zero mode traveling wave signals recorded at bus M, in accordance with an embodiment of the present subject matter.
Figure 18B:
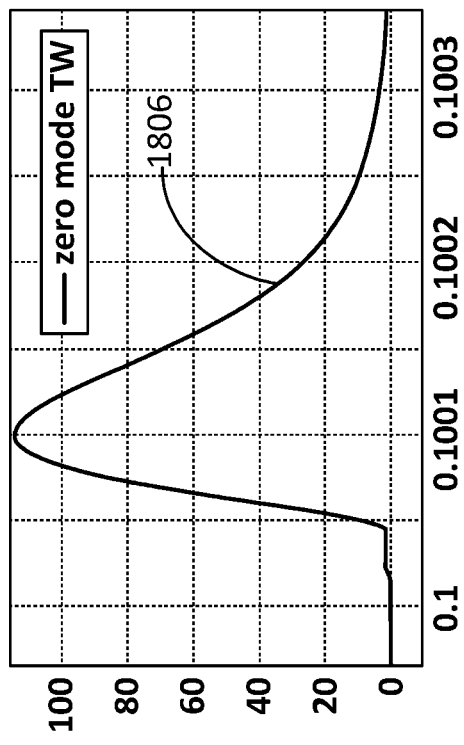

FIGS. 18 (*a*) and 18 (*b*) illustrate, in the first example of the second scenario, the first peaks of beta and zero mode traveling wave signals recorded at bus M, in accordance with an embodiment of the present subject matter. FIG. 18(*a*) illustrates traveling wave signals for A-g fault in beta mode. Line 1802 depicts beta mode signal with reference to phase C and Line 1804 depicts beta mode signal with reference to a phase A. Here, it may be observed that Line 1804 of phase A is minimum and has a negligible magnitude of 8.12e-9. FIG. 18(*b*) illustrates traveling wave signal for zero mode signal represented by Line 1806. As Line 1806 shows that the zero-mode signal has significant magnitude, it is concluded that the fault involves ground and that the fault is classified as phase A to ground A-g fault. In this case, when phase selection using traveling wave-based approach was used it was observed that the time taken for phase selection to identify the fault type as phase A to ground was 34 μs.

Further, for fault inception at 0.1 s, the first three peaks and traveling wave signals recorded at terminal M were used to calculate the line length based on equation (4) as discussed above. On using equation (4), the computed line length was determined to be 39.99 km which was very different from the actual line length of 50 km. Hence, no trip signal was generated based on the traveling wave-based approach. Rather, the time-domain approach is used for zone identification (after phase selection by the traveling wave approach) and generating the trip signal by the hybrid approach. Table 5 provides a comparative study of the operating times for the conventional time-based approach and the hybrid approach.

TABLE 5

COMPARISON OF OPERATING TIMES OF TIME-
DOMAIN BASED AND HYBRID APPROACH

|  | Conventional time-domain solution | Hybrid approach |
| --- | --- | --- |
| Phase selection time | Wrong loop output | 34 µs |
| Zone identification time | 7.5 ms | 7.8 ms |
| Final trip time | No trip | 7.8 ms |

From Table 5, it can be observed that for a fault in segment-1 (0 to ⅓rd) of the transmission line, the time-domain based approach fails to generate a trip signal since fault loop is not identified accurately. However, in the hybrid approach, the traveling wave-based phase selection gives a phase selection within 34 µs and time-domain portion of the zone identification approach generates the trip signal within 7.8 ms (the zone identification is done by time domain approach as the traveling wave approach does not accurately identify the zone). The final trip time is thus 7.8 ms in the hybrid method. Thus, using time-domain algorithms alone may reduce reliability for systems with weak sources/renewables. The hybrid protection solution is proved to increase reliability especially for systems with inverter-based sources.

In a second example, a phase to phase to ground CA-g fault at 66% of line with a fault resistance 50 ohms and fault inception time of 0.29 seconds was considered. The time domain-based approach and the hybrid method with a combination of time-domain based approach and traveling wave-based approach were tested.

Figure 19:
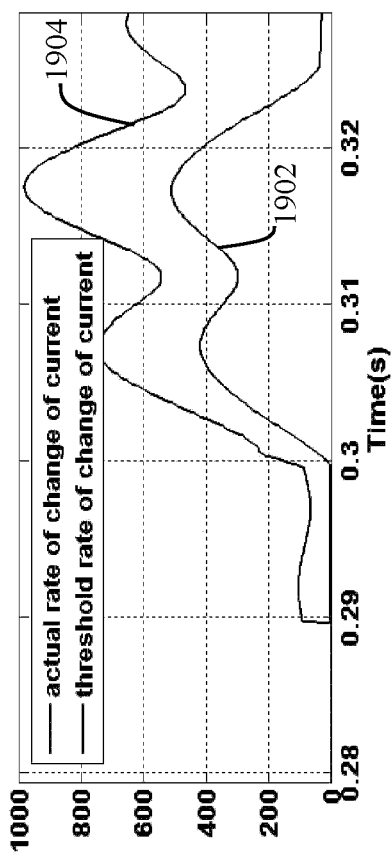
FIG. 19 depicts in a second example of a second scenario, the plot of threshold and actual rate of change of incremental currents for fault zone identification.

FIG. 19 depicts, in the second example of the second scenario, the plot of threshold and actual rate of change of incremental currents for fault zone identification. Line 1902 of the plot represents the actual rate of change of current and Line 1904 of the plot represents the threshold rate of change of current. As it can be observed from the plot, the actual rate of change of current Line 1902 does not cross the threshold rate of change of current Line 1904 and hence the trip signal is not generated. It was observed that phase selection using time-domain based approach takes about 13.7 ms to identify the fault type as a phase C to phase A to ground fault. Further, it was observed that the time domain-based zone identification does not generate a trip signal.

Figure 20A:
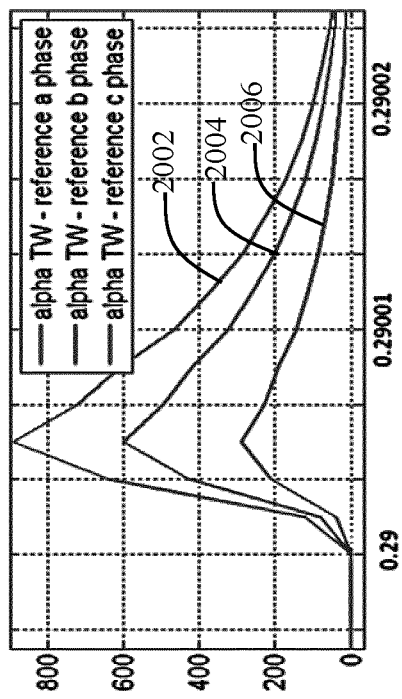
FIGS. 20(a) and 20(b) illustrate, in a second example of a second scenario, the first peaks of alpha and zero mode traveling wave signals recorded at bus M, in accordance with an embodiment of the present subject matter.
Figure 20B:
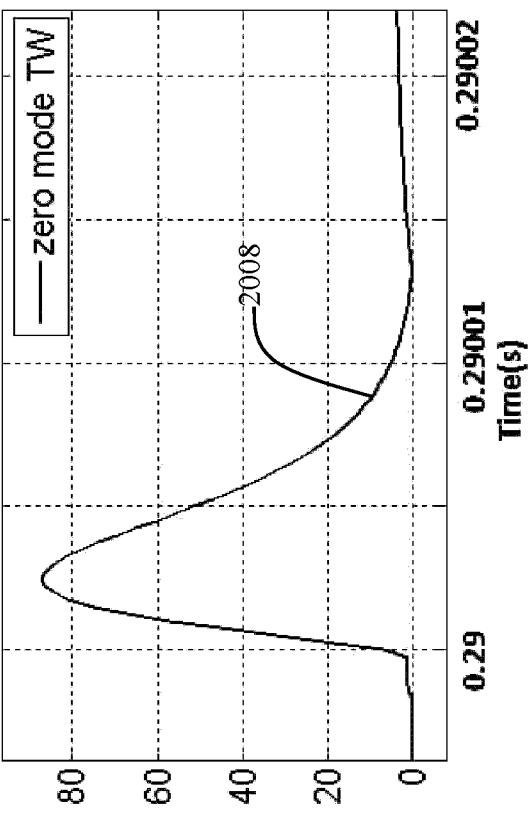

FIGS. 20(a) and 20(b) illustrate, in the second example of the second scenario, the first peaks of alpha and zero mode traveling wave signals recorded at bus M, in accordance with an embodiment of the present subject matter. FIG. 20(a) illustrates traveling wave signals for CA-g fault in alpha mode. Line 2002 depicts alpha mode signal with reference to phase A, Line 2004 depicts alpha mode signal with reference to a phase C, and Line 2006 depicts alpha mode signal with reference to phase B. Here, it may be observed that Line 2006 is minimum compared to Line 2002 and Line 2004. FIG. 20(b) illustrates traveling wave signal for zero mode signal represented by Line 2008. As Line 2008 shows that the zero-mode signal has significant magnitude, it is concluded that the fault involves ground and that the fault is classified as phase C to phase A to ground CA-g fault. In this case, when phase selection using traveling wave-based approach was used it was observed that the time taken for phase selection to identify the fault type as phase C to phase A to ground fault was 36 µs.

Figure 21:
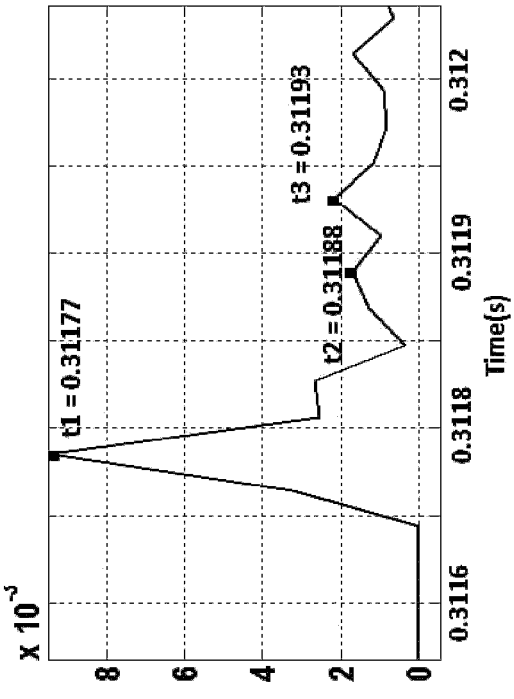
FIG. 21 illustrates, in a second example of a second scenario, traveling wave signals recorded at bus M depicting the first three peaks and their arrival times, in accordance with an embodiment of the present subject matter.

FIG. 21 illustrates, in the second example of the second scenario, traveling wave signals recorded at bus M depicting the first three peaks and their arrival times, in accordance with an embodiment of the present subject matter. For fault inception at 0.29 s, the first three peaks and traveling wave signals recorded at terminal M were used to calculate the line length based on equation (4) as discussed above. On using equation (4), the computed line length was determined to be 59.99 km which was very close to the actual line length of 50 km. Hence, a trip signal was generated based on the traveling wave-based approach (of the hybrid method) at approximately 0.27 ms. Table 6 provides a comparative study of the operating times for the conventional time-based approach and the hybrid approach.

TABLE 6

COMPARISON OF OPERATING TIMES OF TIME-
DOMAIN BASED AND HYBRID APPROACH

|  | Conventional time-domain solution | Hybrid approach |
| --- | --- | --- |
| Phase selection time | 13.7 ms | 36 µs |
| Zone identification time | No Trip | 0.27 ms |
| Final trip time | No Trip | 0.27 ms |

From Table 6, it can be observed that for a fault in segment-2 (⅓rd to ⅔rd) of the transmission line, the time-domain algorithm alone fails to generate a trip signal. However, in the hybrid approach, the traveling wave-based phase selection gives a phase selection signal within 36 µs and traveling wave-based zone identification approach generates the trip signal within 0.27 ms. The final trip time is thus 0.27 ms in the hybrid method. The hybrid approach generates trip signal with increased speed, even when the time-domain approach fails. Therefore, the hybrid solution increases reliability especially for faults very close to zone boundary. Also, the hybrid protection solution is proved to increase reliability especially for systems with inverter-based sources.

The system and method were tested for different systems including normal single circuit transmission line, double-circuit line, series compensated line and lines with weak sources. The result summary for each of these systems are given below.

Figure 22A:
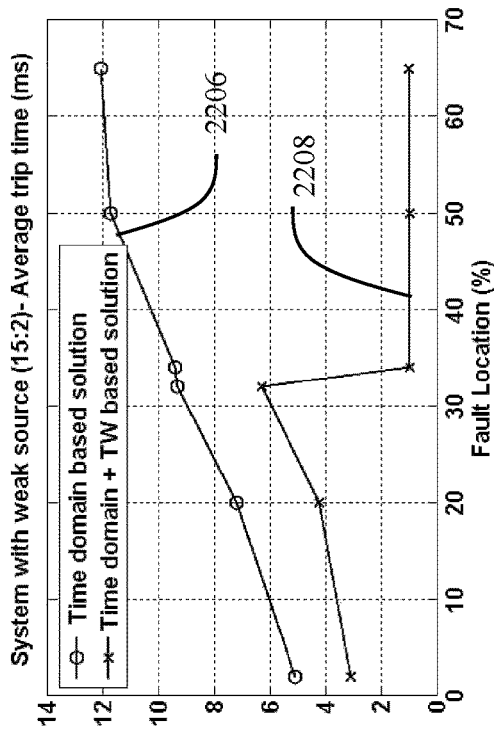
FIGS. 22(a) and 22(b) illustrate, in one example, operation times for a system with weak inverter-based resources to determine the dependability of the system with the conventional approach and the hybrid approach in accordance with an embodiment of the present subject matter.
Figure 22B:
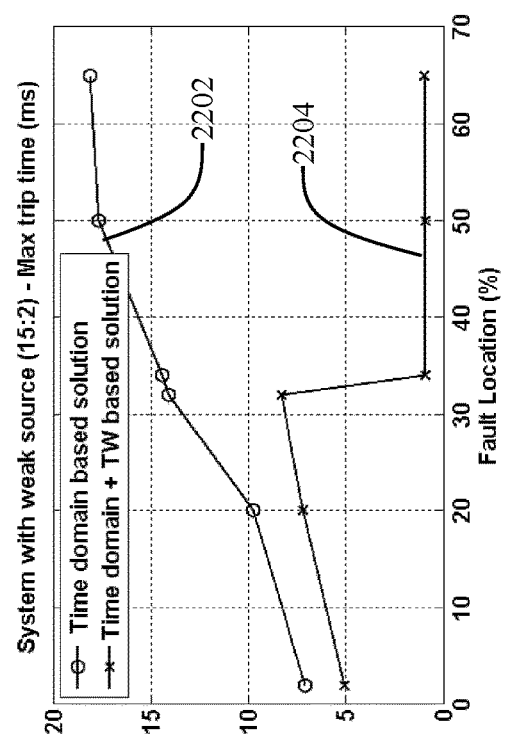

FIGS. 22(a) and 22(b) illustrate, in one example, operation times for a system with weak inverter-based resources to determine the dependability of the system with the conventional approach and the hybrid approach, in accordance with an embodiment of the present subject matter. A system with an inverter-based resource for a 100 km transmission line having a source to impedance ratio of 15:2 was considered. FIG. 22(a) and FIG. 22(b) illustrate the plot of operation times obtained with the conventional time domain approach and the hybrid approach. In FIG. 22(a) the location of the fault is plotted against maximum trip time measured in milliseconds. Line 2202 represents the operation time plot obtained for the conventional time domain-based approach and Line 2204 represents the operation time plot obtained for the hybrid approach. In FIG. 22(b) the location of the fault is plotted against average trip time measured in milliseconds. Line 2206 represents the operation time plot obtained for the conventional time domain-based approach and Line 2208 represents the operation time plot obtained for the hybrid approach. From FIG. 22(a) and FIG. 22(b) it may be observed that as the location (%) increases along the x-axis, the time taken for the system to generate a trip signal based on the conventional approach also increases, whereas the time taken for the system to generate a trip signal based on the hybrid approach is relatively very less, thereby increasing the dependability of the system.

Based on the operation times obtained from both the conventional and the hybrid method, the reliability of the system using the two methods is depicted in Table 7.

TABLE 7

System Reliability using conventional approach and the solution

| | Fault Location | | | | | | | | |
|---|---|---|---|---|---|---|---|---|---|
| | Dependability (%) | | | | | | | Security (%) | |
| | 2% | 20% | 32% | 34% | 50% | 65% | 67% | 84% | 95% |
| Time domain-based solution | 100 | 100 | 100 | 100 | 86 | 67 | 65 | 100 | 100 |
| Hybrid Approach | 100 | 100 | 100 | 100 | 100 | 100 | 100 | 100 | 100 |

It is observed that as the fault location increases beyond one-thirds of the transmission line length, the conventional approach does not yield 100% accurate results, whereas the hybrid approach yields 100% reliable results.

Figure 23A:
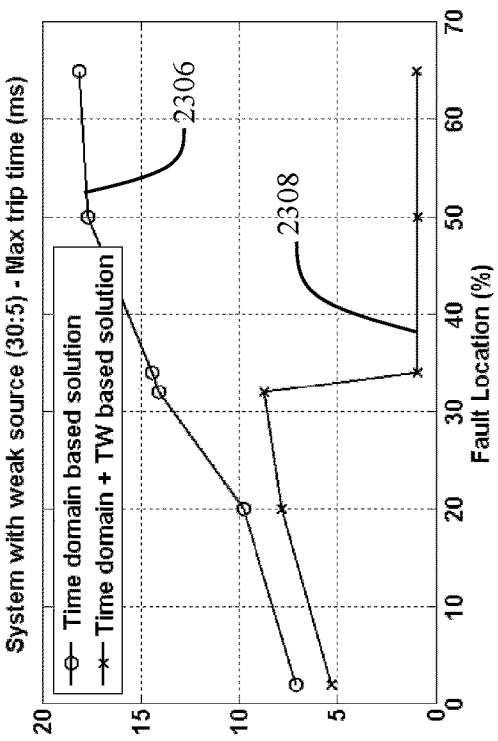
FIGS. 23(a) and 23(b) illustrate, in another example, operation times for a system with weak inverter-based resources to determine the dependability of the system with the conventional approach and the hybrid approach, in accordance with an embodiment of the present subject matter.
Figure 23B:
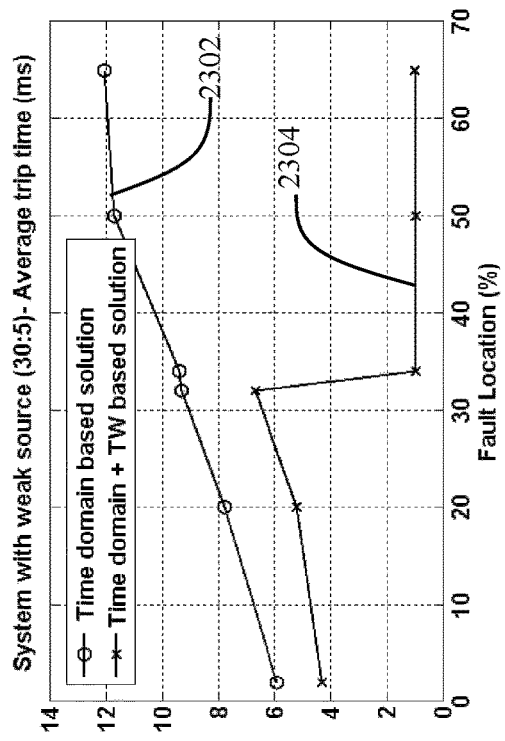

FIGS. 23(a) and 23(b) illustrate, in another example, operation times for a system with weak inverter-based resources to determine the dependability of the system with the conventional approach and the hybrid approach, in accordance with an embodiment of the present subject matter. A system with an inverter-based resource for a 50 km transmission line having a source to impedance ratio of 30:5 was considered. FIG. 23(a) and FIG. 23(b) illustrate the plot of operation times obtained with the conventional time domain approach and the hybrid approach. In FIG. 23(a) the location of the fault is plotted against average trip time measured in milliseconds. Line 2302 represents the operation time plot obtained for the conventional time domain-based approach and Line 2304 represents the operation time plot obtained for the hybrid approach. In FIG. 23(b) the location of the fault is plotted against maximum trip time measured in milliseconds. Line 2306 represents the operation time plot obtained for the conventional time domain-based approach and Line 2308 represents the operation time plot obtained for the hybrid approach. From FIG. 23(a) and FIG. 23(b) it may be observed that as the location (%) increases along the x-axis, the time taken for the system to generate a trip signal based on the conventional approach also increases, whereas the time taken for the system to generate a trip signal based on the hybrid approach is relatively very less, thereby increasing the dependability of the solution.

Based on the operation times obtained from both the conventional and hybrid method, the reliability of the system using the two methods is depicted in Table 8.

It is observed that as the fault location increases beyond one-thirds of the transmission line length, the conventional approach does not yield 100% accurate results, whereas the hybrid approach yields 100% reliable results.

Figure 24A:
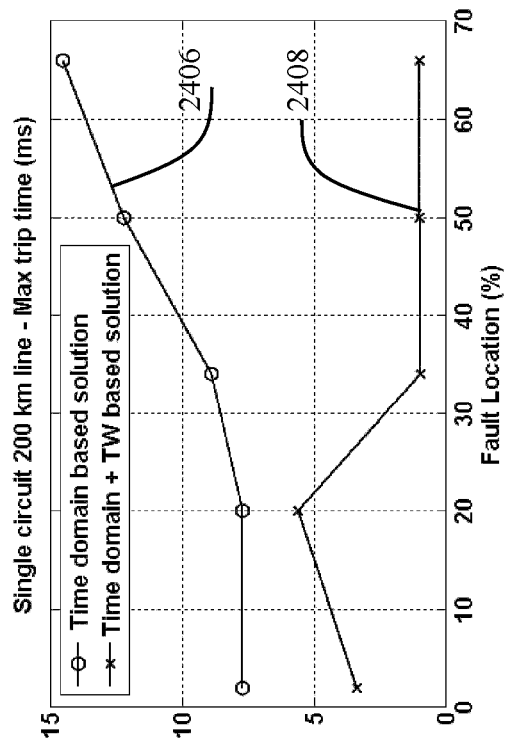
FIGS. 24(a) and 24(b) illustrate, in yet another example, operation times for a normal transmission line to determine the dependability of the system with the conventional approach and the hybrid approach in accordance with an embodiment of the present subject matter.
Figure 24B:
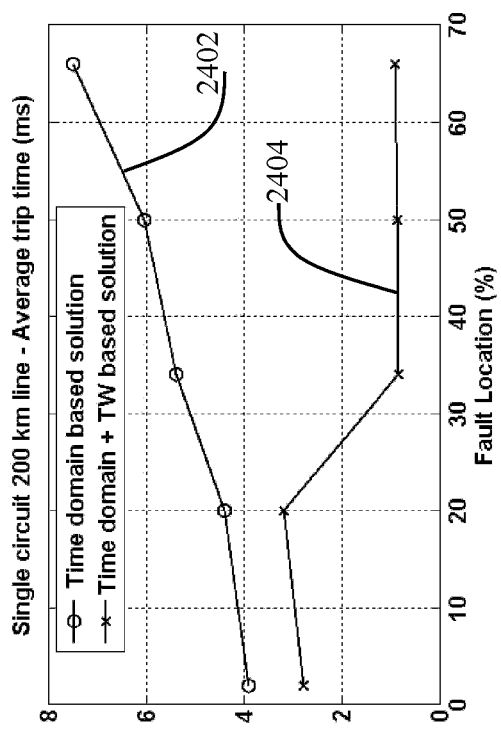

FIGS. 24(a) and 24(b) illustrate, in yet another example, operation times for a normal transmission line to determine the dependability of the system with the conventional approach and the hybrid approach, in accordance with an embodiment of the present subject matter. A single-circuit transmission line of 200 km was considered. FIG. 24(a) and FIG. 24(b) illustrate, the plot of operation times obtained with the conventional time domain approach and the hybrid approach. In FIG. 24(a) the location of the fault is plotted against average trip time measured in milliseconds. Line 2402 represents the operation time plot obtained for the conventional time domain-based approach and Line 2404 represents the operation time plot obtained for the hybrid approach. In FIG. 24(b) the location of the fault is plotted against maximum trip time measured in milliseconds. Line 2406 represents the operation time plot obtained for the conventional time domain-based approach and Line 2408 represents the operation time plot obtained for the hybrid approach. From FIG. 24(a) and FIG. 24(b) it may be observed that as the location (%) increases along the x-axis, the time taken for the system to generate a trip signal based on the conventional approach also increases, whereas the time taken for the system to generate a trip signal based on the hybrid approach is relatively very less, thereby increasing the dependability of the system.

Based on the operation times obtained from both the conventional and hybrid method, the reliability of the system using the two methods is depicted in Table 9.

TABLE 8

System Reliability using conventional approach and the solution

| | Fault Location | | | | | | | |
|---|---|---|---|---|---|---|---|---|
| | Dependability (%) | | | | | | | Security (%) |
| | 2% | 20% | 32% | 34% | 64% | 68% | 80% | 96% |
| Time domain-based solution | 100 | 100 | 97 | 91 | 67 | 65 | 100 | 100 |
| Hybrid Approach | 100 | 100 | 97 | 100 | 100 | 100 | 100 | 100 |

TABLE 9

System Reliability using conventional approach and the solution

| | Fault Location | | | | | |
|---|---|---|---|---|---|---|
| | Dependability (%) | | | | | Security (%) |
| | 2% | 20% | 34% | 50% | 66% | 96% |
| Time domain-based solution | 100 | 100 | 95 | 85 | 77 | 100 |
| Hybrid Approach | 100 | 100 | 100 | 100 | 100 | 100 |

It is observed that as the fault location increases beyond one-thirds of the transmission line length, the conventional approach does not yield 100% accurate results, whereas the hybrid approach yields 100% reliable results.

Figure 25A:
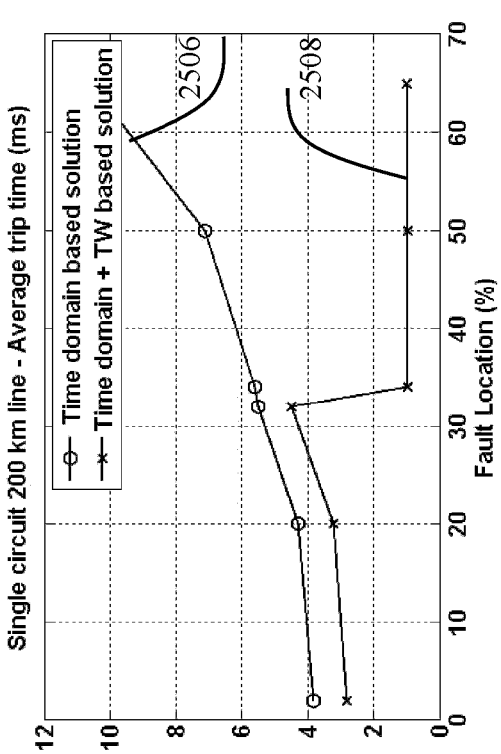
FIGS. 25(a) and 25(b) illustrate, in yet another example, operation times for double circuit transmission line to determine the dependability of the system with the conventional approach and the hybrid approach, in accordance with an embodiment of the present subject matter.
Figure 25B:
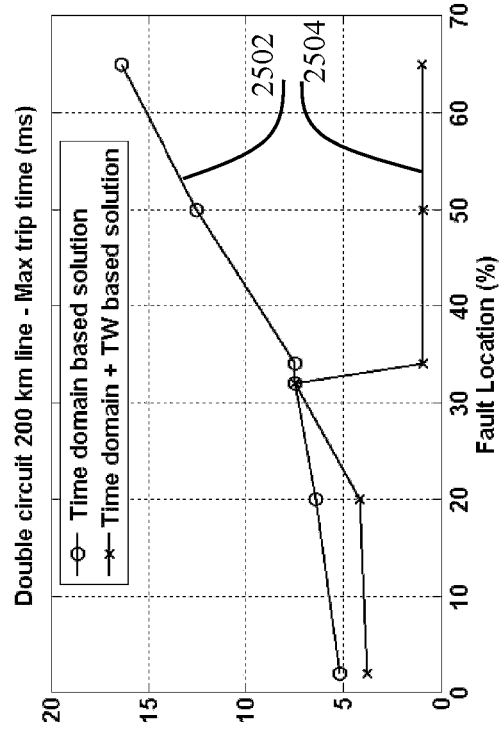

FIGS. 25(a) and 25(b) illustrate, in yet another example, operation times for double circuit transmission line to determine the dependability of the system with the conventional approach and the hybrid approach, in accordance with an embodiment of the present subject matter. A double circuit transmission line of 200 km was considered. FIG. 25(a) and FIG. 25(b) illustrate the plot of operation times obtained with the conventional time domain approach and the hybrid approach. In FIG. 25(a) the location of the fault is plotted against maximum trip time measured in milliseconds. Line 2502 represents the operation time plot obtained for the conventional time domain-based approach and Line 2504 represents the operation time plot obtained for the hybrid approach. In FIG. 25(b) the location of the fault is plotted against average trip time measured in milliseconds. Line 2506 represents the operation time plot obtained for the conventional time domain-based approach and Line 2508 represents the operation time plot obtained for the hybrid approach. From FIG. 25(a) and FIG. 25(b) it may be observed that as the location (%) increases along the x-axis, the time taken for the system to generate a trip signal based on the conventional approach also increases, whereas the time taken for the system to generate a trip signal based on the hybrid approach is relatively very less, thereby increasing the dependability of the system.

Based on the operation times obtained from both the conventional and hybrid method, the reliability of the system using the two methods is depicted in Table 10.

TABLE 10

System Reliability using conventional approach and the solution

| | Fault Location | | | | | | | | |
|---|---|---|---|---|---|---|---|---|---|
| | Dependability (%) | | | | | | | Security (%) | |
| | 2% | 20% | 32% | 34% | 50% | 65% | 67% | 84% | 95% |
| Time domain-based solution | 100 | 100 | 100 | 100 | 100 | 94 | 91 | 100 | 100 |
| Hybrid Approach | 100 | 100 | 100 | 100 | 100 | 100 | 100 | 100 | 100 |

It is observed that as the fault location increases beyond one-thirds of the transmission line length, the conventional approach does not yield 100% accurate results, whereas the hybrid approach yields 100% reliable results.

Figure 26B:
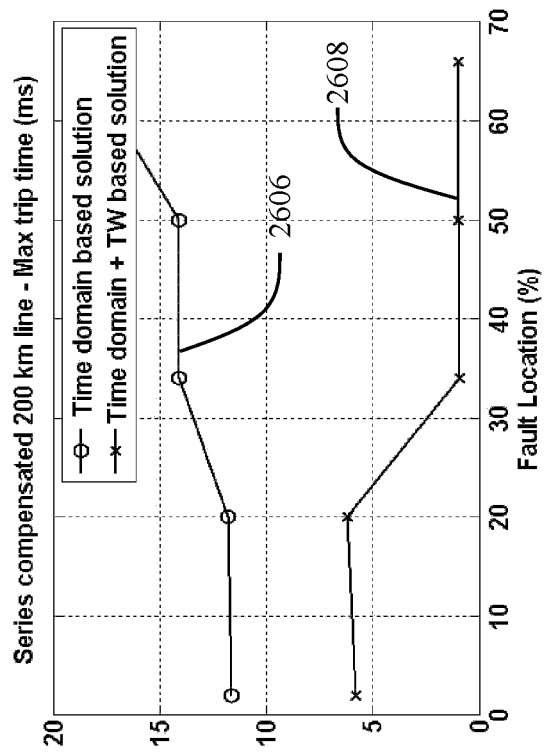
FIGS. 26(a) and 26(b) illustrate, in yet another example, operation times for series compensated lines to determine the dependability of the system with the conventional approach and the hybrid approach in accordance with an embodiment of the present subject matter.
Figure 26A:
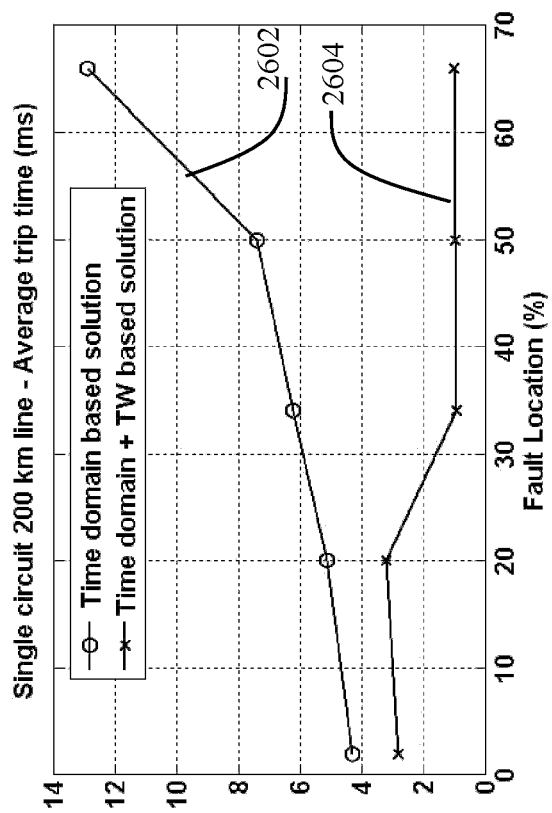

FIGS. 26(a) and 26(b) illustrate, in yet another example, operation times for series compensated lines to determine the dependability of the system with the conventional approach and the hybrid approach, in accordance with an embodiment of the present subject matter. A series compensated line of 200 km was considered. FIG. 26(a) and FIG. 26(b) illustrate the plot of operation times obtained with the conventional time domain approach and the hybrid approach. In FIG. 26(a) the location of the fault is plotted against average trip time measured in milliseconds. Line 2602 represents the operation time plot obtained for the conventional time domain-based approach and Line 2604 represents the operation time plot obtained for the hybrid approach. In FIG. 26(b) the location of the fault is plotted against maximum trip time measured in milliseconds. Line 2606 represents the operation time plot obtained for the conventional time domain-based approach and Line 2608 represents the operation time plot obtained for the hybrid approach. From FIG. 26(a) and FIG. 26(b) it may be observed that as the location (%) increases along the x-axis, the time taken for the system to generate a trip signal based on the conventional approach also increases, whereas the time taken for the system to generate a trip signal based on the hybrid approach is relatively very less, thereby increasing the dependability of the system.

Based on the operation times obtained from both the conventional and hybrid method, the reliability of the system using the two methods is depicted in Table 11.

TABLE 11

System Reliability using conventional approach and the solution

| | Fault Location | | | | | |
|---|---|---|---|---|---|---|
| | Dependability (%) | | | | | Security (%) |
| | 2% | 20% | 34% | 50% | 66% | 95% |
| Time domain-based solution | 100 | 100 | 95 | 85 | 82 | 100 |
| Hybrid Approach | 100 | 100 | 100 | 100 | 100 | 100 |

It is observed that as the fault location increases beyond one-thirds of the transmission line length, the conventional approach does not yield 100% accurate results, whereas the hybrid approach yields 100% reliable results.

The present subject matter thus provides an accurate method to classify a fault and identify the zone of the transmission line in which the fault is located. The method is robust against the fault types, location and fault resistances. Thus, for inverter-based resources or traditional sources the present subject matter provides high dependability, with increased speed and security.

Although the present subject matter has been described with reference to specific embodiments, this description is not meant to be construed in a limiting sense. Various modifications of the disclosed embodiments, as well as alternate embodiments of the subject matter, will become apparent to persons skilled in the art upon reference to the description of the subject matter.

The invention claimed is:

1. A method for zone identification of a fault comprising:
identifying a zone of a transmission line where the fault lies based on traveling wave signals when a difference between a computed line length and an actual line length is less than a threshold line length; and
identifying the zone of the transmission line where the fault lies based on a rate of change of incremental terminal current with reference to time when the difference between the computed line length and the actual line length is greater than the threshold line length.

2. The method as claimed in claim 1 comprising:
receiving an identification of a transmission line having the fault; and
computing a line length of the transmission line, to obtain the computed line length, based on traveling wave signals obtained from modal transformations performed on voltage or current measurements determined at a terminal of the transmission line during the fault.

3. The method as claimed in claim 2, wherein the zone identified based on the traveling wave signals lies in a range of one-thirds to two-thirds of the actual line length from the terminal and the zone identified based on the rate of change of incremental terminal current lies in a range of one-thirds of the actual line length from the terminal.

4. An intelligent electronic device comprising a processor configured to execute the method as claimed in claim 3.

5. A non-transitory computer readable medium comprising instructions that, when executed by a processor, cause the processor to execute the method of claim 3.

6. An intelligent electronic device comprising a processor configured to execute the method as claimed in claim 1.

7. A non-transitory computer readable medium comprising instructions that, when executed by a processor, cause the processor to execute the method of claim 1.

8. A method for fault classification and zone identification, comprising:
identifying a zone of a transmission line where a fault lies based on traveling wave signals when a difference between a computed line length and an actual line length is less than a threshold line length;
identifying the zone of the transmission line where the fault lies based on a rate of change of incremental terminal current with reference to time when the difference between the computed line length and the actual line length is greater than the threshold line length;
obtaining voltage or current measurements at a terminal of the transmission line in each of three phases measured during the fault;
performing modal transformations on the voltage or current measurements to obtain traveling wave signals with reference to each of the three phases; and
classifying the fault based on a magnitude of the traveling wave signals.

9. An intelligent electronic device comprising a processor configured to execute the method as claimed in claim 8.

10. A non-transitory computer readable medium comprising instructions that, when executed by a processor, cause the processor to execute the method of claim 8.

* * * * *